(12) United States Patent
Murakami

(10) Patent No.: US 7,630,842 B2
(45) Date of Patent: Dec. 8, 2009

(54) SECONDARY BATTERY CHARGE/DISCHARGE ELECTRICITY AMOUNT ESTIMATION METHOD AND DEVICE, SECONDARY BATTERY POLARIZATION VOLTAGE ESTIMATION METHOD AND DEVICE AND SECONDARY BATTERY REMAINING CAPACITY ESTIMATION METHOD AND DEVICE

(75) Inventor: Yusai Murakami, Chiba (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 211 days.

(21) Appl. No.: 11/814,898

(22) PCT Filed: Jan. 27, 2005

(86) PCT No.: PCT/JP2005/001116

§ 371 (c)(1),
(2), (4) Date: Jul. 31, 2007

(87) PCT Pub. No.: WO2006/080067

PCT Pub. Date: Aug. 3, 2006

(65) Prior Publication Data

US 2008/0162059 A1     Jul. 3, 2008

(51) Int. Cl.
*G06F 19/00* (2006.01)

(52) U.S. Cl. .................... 702/64; 702/63; 320/127; 320/137

(58) Field of Classification Search .................... 702/64, 702/63; 320/127, 132, 134, 136–137; 324/427–428
See application file for complete search history.

(56) References Cited

U.S. PATENT DOCUMENTS 6,160,380 A * 12/2000 Tsuji et al. .................. 320/132
2004/0239333 A1* 12/2004 Kikuchi ...................... 324/434

FOREIGN PATENT DOCUMENTS

| JP | 6-331714 | 12/1994 |
| JP | 2000-147075 | 5/2000 |
| JP | 2001-223033 | 8/2001 |

* cited by examiner

*Primary Examiner*—Drew A Dunn
*Assistant Examiner*—Hien X Vo
(74) *Attorney, Agent, or Firm*—Workman Nydegger

(57) ABSTRACT

If a particular selection condition is satisfied, a non-load voltage calculation unit (105) calculates a no-load voltage Vsep as a voltage piece when the current in approximate straight line obtained by statistical processing using the method of least squares for a plurality of sets of data containing current data I(n) and voltage data V(n) is zero. If a particular current condition or voltage condition is continuously satisfied for a predetermined time, an open-circuit voltage calculation unit (106) calculates a secondary cell terminal voltage as an open-circuit voltage Voc and a voltage-at-zero-current storing unit (108) stores voltage-at-zero-current Vzo calculated by a voltage-at-zero-current calculation unit (107). By using a predetermined voltage change amount adjustment constant ΔVbc/adjustment coefficient Kb, an electromotive force change constant Keq, and a polarization voltage generation constant Kpol, an estimated charge/discharge electric amount calculation unit (118A) calculates an estimated charge/discharge electricity amount ΔQe as a function of the change amount ΔVzo of a voltage-at-zero-current Vzo. It is possible to estimate charge/discharge electricity amount without being affected by the current measurement error.

28 Claims, 11 Drawing Sheets

SECONDARY BATTERY CHARGE/DISCHARGE ELECTRICITY AMOUNT ESTIMATION METHOD AND DEVICE, SECONDARY BATTERY POLARIZATION VOLTAGE ESTIMATION METHOD AND DEVICE AND SECONDARY BATTERY REMAINING CAPACITY ESTIMATION METHOD AND DEVICE

FIELD OF THE INVENTION

The present invention relates to a technique for estimating the state of charge (SOC) of a rechargeable battery such as a nickel-metal hydride battery (Ni-MH) mounted on a pure electric vehicle (PEV), a hybrid electric vehicle (HEV), and the like as a power source for a motor or a drive source for various loads.

BACKGROUND OF THE INVENTION

An HEV conventionally executes state of charge (SOC) control on a rechargeable battery to maximize fuel consumption efficiency of the vehicle by detecting voltage, current, temperature, and the like of the rechargeable battery and performing calculations to estimate the SOC of the rechargeable battery. For accurate execution of the SOC control, the SOC of the rechargeable battery during charging/discharging needs to be estimated correctly.

In one conventional method for estimating the SOC, a battery voltage V and a charge-discharge current I are measured over a predetermined period, an integrated value $\int I$ of the current is calculated, and a battery polarization voltage $Vc(t-1)$, which was previously estimated, is updated to $Vc(t)$ based on functions of the temperature T, the battery voltage V, and the integrated current value $\int I$ to obtain a correction voltage V' ($=V-Vc(t)$). A plurality of data sets for the correction voltage V' and current I are obtained and stored. A linear regression line (voltage V'-current I regression line) is obtained through regression analysis using the data sets. A V intercept of the V'-I regression line is estimated as an electromotive force E, and the SOC is estimated from functions of the previously estimated SOC, the electromotive force E, the temperature T, and the current integration value $\int I$ (refer, for example, to patent document 1).

Patent Document 1: Japanese Laid-Open Patent Publication No. 2001-223033

SUMMARY OF THE INVENTION

However, the above conventional SOC estimation method has the following problems.

To estimate the SOC, the method first measures a charging/discharging current flowing through the rechargeable battery with a current sensor. The current sensor needs to measure a large current when used, for example, in an HEV. When a high-precision current sensor is used, the cost will increase. Thus, there is no other way but to use an inexpensive current sensor having a relatively low precision. A current value detected with such a current sensor includes a measurement error. The current error appears as an estimation error of the SOC. In particular, when the charging/discharging rate is smaller than the current error (when, for example, the charging/discharging rate is 1 A and the current error is ±2 A), the estimated SOC starts to behave in an unpredictable manner as time elapses.

Further, like in the above prior art example, when the SOC estimation method takes into consideration the influence of the polarization voltage and updates the previously estimated polarization voltage $Vc(t-1)$ of the battery to $Vc(t)$ as a function of the integrated current value measured with the current sensor, the polarization voltage calculated in the past includes a current error, which leads to an estimation error of the polarization voltage. The estimation error accumulates as time elapses, and increases the error between the true value and the estimated value of the SOC.

Accordingly, it is an object of the present invention to provide a method and an apparatus for estimating a charging/discharging electricity amount and a polarization voltage without being influenced by a current measurement error, and thereby provide a method and an apparatus for estimating an SOC with a high precision even when a current value includes a measurement error.

To achieve the above object, a first aspect of a method for estimating a charging/discharging electricity amount of a rechargeable battery according to the present invention includes the steps of measuring a data set of current flowing through the rechargeable battery and terminal voltage of the rechargeable battery corresponding to the current, and obtaining a plurality of the data sets; calculating a no-load voltage (Vsep) that is a voltage intercept of an approximate line at a zero-current state obtained through statistical processing, such as regression analysis using a least-square method or the like, using the plurality of data sets when a specific selection condition (e.g., the value of the current in the charging direction and the discharging direction is within a predetermined range (e.g., ±50 A), there is at least a predetermined number of the plurality of the data sets in the charging direction and the discharging direction (e.g., ten pieces of data in each direction being included in 60 samples), and the charging/discharging electricity amount during which the plurality of the data sets are being obtained is within a predetermined range (e.g., 0.3 Ah)) is satisfied; calculating an open-circuit voltage (Voc) from the terminal voltage of the rechargeable battery when a specific current condition (e.g., an absolute value of the current is less than 10 A) or voltage condition (e.g., a change amount of the voltage is less than 1 V) is satisfied continuously for a certain period of time (e.g., for 10 seconds); calculating a zero-current state voltage (Vzo) from the no-load voltage or the open-circuit voltage; storing the zero-current state voltage; calculating a zero-current state voltage change amount ($\Delta Vzo$) during a period from when the zero-current state voltage is stored to when a zero-current state voltage is calculated subsequently; and calculating an estimated charging/discharging electricity amount ($\Delta Qe$) of the rechargeable battery based on the zero-current state voltage change amount.

The first aspect of the rechargeable battery charging/discharging electricity amount estimation method according to the present invention further includes the steps of presetting a voltage change amount adjustment constant ($\Delta Vbc$) and a voltage change amount adjustment coefficient (Kb), which are determined depending on a physical property and a charging/discharging state of the rechargeable battery, for the zero-current state voltage change amount ($\Delta Vzo$); presetting an electromotive force change constant (Keq) that is a change amount of an electromotive force for a charging/discharging electricity amount in a usage region of a state of charge and that is determined depending on the physical property and the charging/discharging state of the rechargeable battery; and presetting a polarization voltage generation constant (Kpol) that is a change amount of a polarization voltage for a charging/discharging electricity amount in a usage region of a state of charge and that is determined depending on the physical property and the charging/discharging state of the rechargeable battery. The estimated charging/discharging electricity amount $\Delta Qe$ is calculated as a function of the zero-current state voltage change amount ($\Delta Vzo$) using the expression of $\Delta Qe=Kb*(\Delta Vzo+\Delta Vbc)/(Keq+Kpol)$.

A second aspect of the rechargeable battery charging/discharging electricity amount estimation method according to the present invention further includes in the first aspect of the rechargeable battery charging/discharging electricity amount estimation method according to the present invention the steps of calculating a polarization voltage (Vpol) of the rechargeable battery based on the estimated charging/discharging electricity amount; storing the calculated polarization voltage; calculating a storage time (th) of the polarization voltage; and calculating a time-dependent voltage change amount ($\Delta Vbp(th)$) based on the stored polarization voltage and the storage time. The step of calculating the estimated charging/discharging electricity amount includes calculating an estimated charging/discharging electricity amount based on the time-dependent voltage change amount in addition to the zero-current state voltage change amount.

In this case, the step of calculating the time-dependent voltage change amount includes calculating a time-dependent voltage change amount by multiplying the stored polarization voltage by a polarization attenuation ratio that is a function of the storage time.

The second aspect of the rechargeable battery charging/discharging electricity amount estimation method according to the present invention further includes the steps of presetting a voltage change amount adjustment coefficient (Kb), which is determined depending on a physical property and a charging/discharging state of the rechargeable battery, for the zero-current state voltage change amount ($\Delta Vzo$); presetting an electromotive force change constant (Keq) that is a change amount of an electromotive force with respect to a charging/discharging electricity amount in a usage region of a state of charge and that is determined depending on the physical property and the charging/discharging state of the rechargeable battery; and presetting a polarization voltage generation constant (Kpol) that is a change amount of a polarization voltage with respect to a charging/discharging electricity amount in a usage region of a state of charge and that is determined depending on the physical property and the charging/discharging state of the rechargeable battery. The estimated charging/discharging electricity amount $\Delta Qe$ is calculated as a function of the zero-current state voltage change amount $\Delta Vzo$ and the time-dependent voltage change amount $\Delta Vbp(th)$ using the expression of $$\Delta Qe=Kb*(\Delta Vzo+\Delta Vbp(th))/(Keq+Kpol).$$

A third aspect of the rechargeable battery charging/discharging electricity amount estimation method according to the present invention further includes in the first aspect of the rechargeable battery charging/discharging electricity amount estimation method according to the present invention the steps of calculating a polarization voltage of the rechargeable battery based on the estimated charging/discharging electricity amount, calculating an electromotive force (Veq) of the rechargeable battery based on the stored zero-current state voltage and the polarization voltage; storing the calculated electromotive force; calculating a measured charging/discharging electricity amount ($\Delta Qm$) during a period in which the electromotive force is being stored from current flowing through the rechargeable battery; calculating an electromotive force for calculating the estimated charging/discharging electricity amount (Veq2) based on the stored electromotive force and the measured charging/discharging electricity amount; and calculating an electromotive force change amount ($\Delta Veq$) that is a difference between the electromotive force for calculating the estimated charging/discharging electricity amount and the stored electromotive force. The step of calculating the estimated charging/discharging electricity amount includes calculating an estimated charging/discharging electricity amount based on the electromotive force change amount in addition to the zero-current state voltage change amount.

In this case, the step of calculating the electromotive force for calculating the estimated charging/discharging electricity amount includes calculating, as the electromotive force for calculating the estimated charging/discharging electricity amount (Veq2), an electromotive force corresponding to a state of charge obtained by subtracting or adding the measured charging/discharging electricity amount ($\Delta Qm$) from or to a state of charge corresponding to the stored electromotive force by referring to an electromotive force characteristic with respect to a state of charge of the rechargeable battery that is prepared beforehand and is parameterized by a temperature.

The third aspect of the rechargeable battery charging/discharging electricity amount estimation method according to the present invention further includes the steps of presetting for the zero-current state voltage change amount ($\Delta Vzo$) a voltage change amount adjustment constant ($\Delta Vbc$) and a voltage change amount adjustment coefficient (kb) that are determined depending on a physical property and a charging/discharging state of the rechargeable battery, and presetting a polarization voltage generation constant (Kpol) that is a change amount of a polarization voltage for a charging/discharging electricity amount in a usage region of a state of charge and that is determined depending on the physical property and the charging/discharging state of the rechargeable battery. The estimated charging/discharging electricity amount $\Delta Qe$ is calculated as a function of the zero-current state voltage change amount $\Delta Vzo$, the electromotive force change amount, and the measured charging/discharging electricity amount using the expression of $\Delta Qe=Kb*(\Delta Vzo+\Delta Vbc)/(\Delta Veq/\Delta Qm+Kpol)$.

A fourth aspect of the rechargeable battery charging/discharging electricity amount estimation method according to the present invention further includes in the first aspect of the rechargeable battery charging/discharging electricity amount estimation method according to the present invention the steps of calculating a polarization voltage (Vpol) of the rechargeable battery based on the estimated charging/discharging electricity amount; storing the calculated polarization voltage; calculating a storage time (th) of the polarization voltage; calculating a time-dependent voltage change amount ($\Delta Vbp(th)$) based on the stored polarization voltage and the storage time; calculating an electromotive force (Veq) of the rechargeable battery based on the stored zero-current state voltage and the stored polarization voltage; storing the calculated electromotive force; calculating a measured charging/discharging electricity amount ($\Delta Qm$) during a period in which the electromotive force is being stored from current flowing through the rechargeable battery; calculating an electromotive force for calculating the estimated charging/discharging electricity amount (Veq2) based on the stored electromotive force and the measured charging/discharging electricity amount; and calculating an electromotive force change amount ($\Delta Veq$) that is a difference between the electromotive force for calculating the estimated charging/discharging electricity amount and the stored electromotive force. The step of calculating the estimated charging/discharging electricity amount includes calculating an estimated charging/discharging electricity amount based on the time-dependent voltage change amount and the electromotive force change amount in addition to the zero-current state voltage change amount.

In this case, the step of calculating the time-dependent voltage change amount includes calculating a time-dependent voltage change amount by multiplying the stored polarization voltage by a polarization attenuation ratio that is a function of the storage time.

Further, the step of calculating the electromotive force for calculating the estimated charging/discharging electricity amount includes calculating, as the electromotive force for calculating the estimated charging/discharging electricity amount (Veq2), an electromotive force corresponding to a state of charge obtained by subtracting or adding the measured charging/discharging electricity amount ($\Delta Qm$) from or to a state of charge corresponding to the stored electromotive force by referring to an electromotive force characteristic with respect to a state of charge of the rechargeable battery that is preset and is parameterized by a temperature.

A fourth aspect of the rechargeable battery charging/discharging electricity amount estimation method according to the present invention further includes the steps of presetting an adjustment coefficient (Kb), which is determined depending on a physical property and a charging/discharging state of the rechargeable battery, for the zero-current state voltage change amount ($\Delta Vzo$); and presetting a polarization voltage generation constant (Kpol) that is a change amount of a polarization voltage for a charging/discharging electricity amount in a usage area of a state of charge and that is determined depending on the physical property and the charging/discharging state of the rechargeable battery. The estimated charging/discharging electricity amount $\Delta Qe$ is calculated as a function of the zero-current state voltage change amount $\Delta Vzo$, the time-dependent voltage change amount $\Delta Vbp(th)$, the electromotive force change amount $\Delta Veq$, and the measured charging/discharging electricity amount $\Delta Qm$ using the expression of $\Delta Qe=Kb*(\Delta Vzo+\Delta Vbp(th))/(\Delta Veq/\Delta Qm+Kpol)$.

To achieve the above object, a first aspect of an apparatus for estimating a charging/discharging electricity amount of a rechargeable battery according to the present invention includes a current measurement unit for measuring current flowing through the rechargeable battery as current data ($I(n)$); a voltage measurement unit for measuring terminal voltage of the rechargeable battery as voltage data ($V(n)$); a no-load voltage calculation unit for obtaining a plurality of data sets, each including current data from the current measurement unit and voltage data from the voltage measurement unit corresponding to the current data, and for calculating a no-load voltage (Vsep) that is a voltage intercept of an approximate line at a zero-current state obtained through statistical processing, such as regression analysis using a least-square method or the like, using the plurality of data sets when a specific selection condition (e.g., the value of the current in the charging direction and the discharging direction is within a predetermined range (e.g., ±50 A), there is at least a predetermined number of the plurality of the data sets in the charging direction and the discharging direction (e.g., ten pieces of data in each direction being included in 60 samples), and the charging/discharging electricity amount during which the plurality of the data sets are being obtained is within a predetermined range (e.g., 0.3 Ah)) is satisfied; an open-circuit voltage calculation unit for calculating an open-circuit voltage (Voc) from the terminal voltage of the rechargeable battery when a specific current condition (e.g., an absolute value of the current is less than 10 A) or voltage condition (e.g., a change amount of the voltage is less than 1 V) is satisfied continuously for a predetermined period of time (e.g., for 10 seconds); a zero-current state voltage calculation unit for calculating a zero-current state voltage (Vzo) from the no-load voltage or the open-circuit voltage; a zero-current state voltage storage unit for storing the zero-current state voltage; a zero-current state voltage change amount calculation unit for calculating a zero-current state voltage change amount ($\Delta Vzo$) during a period from when the zero-current state voltage is stored to when a zero-current state voltage is calculated subsequently; and an estimated charging/discharging electricity amount calculation unit for calculating an estimated charging/discharging electricity amount ($\Delta Qe$) of the rechargeable battery based on the zero-current state voltage change amount.

The first aspect of the rechargeable battery charging/discharging electricity amount estimation apparatus according to the present invention further includes a voltage change amount adjustment constant-adjustment coefficient setting unit for presetting a voltage change amount adjustment constant ($\Delta Vbc$) and a voltage change amount adjustment coefficient (Kb), which are determined depending on a physical property and a charging/discharging state of the rechargeable battery, for the zero-current state voltage change amount ($\Delta Vzo$); an electromotive force change constant setting unit for presetting an electromotive force change constant (Keq) that is a change amount of an electromotive force with respect to a charging/discharging electricity amount in a usage region of a state of charge and that is determined depending on the physical property and the charging/discharging state of the rechargeable battery; and a polarization voltage generation constant setting unit for presetting a polarization voltage generation constant (Kpol) that is a change amount of a polarization voltage with respect to a change amount of a charging/discharging electricity amount in a usage region of a state of charge and that is determined depending on the physical property and the charging/discharging state of the rechargeable battery. The estimated charging/discharging electricity amount calculation unit calculates the estimated charging/discharging electricity amount $\Delta Qe$ as a function of the zero-current state voltage change amount $\Delta Vzo$ using the expression of $\Delta Qe=Kb*(\Delta Vzo+\Delta Vbc)/(Keq+Kpol)$.

A second aspect of the rechargeable battery charging/discharging electricity amount estimation apparatus according to the present invention includes in the first aspect of the rechargeable battery charging/discharging electricity amount estimation apparatus according to the present invention a polarization voltage calculation unit for calculating a polarization voltage (Vpol) of the rechargeable battery based on the estimated charging/discharging electricity amount; a polarization voltage storage unit for storing the polarization voltage calculated by the polarization voltage calculation unit; and a time-dependent voltage change amount calculation unit for calculating a time-dependent voltage change amount ($\Delta Vbp(th)$) based on the polarization voltage stored in the polarization voltage storage unit and a storage time of the polarization voltage. The estimated charging/discharging electricity amount calculation unit calculates the estimated charging/discharging electricity amount based on the time-dependent voltage change amount in addition to the zero-current state voltage change amount.

In this case, the time-dependent voltage change amount calculation unit calculates the time-dependent voltage change amount by multiplying the polarization voltage stored in the polarization voltage storage unit by a polarization attenuation ratio that is a function of the storage time.

The second aspect of the rechargeable battery charging/discharging electricity amount estimation apparatus according to the present invention further includes a voltage change amount adjustment coefficient setting unit for presetting a voltage change amount adjustment coefficient (Kb), which is determined depending on a physical property and a charging/discharging state of the rechargeable battery, for the zero-current state voltage change amount ($\Delta$Vzo); an electromotive force change constant setting unit for presetting an electromotive force change constant (Keq) that is a change amount of an electromotive force with respect to a charging/discharging electricity amount in a usage region of a state of charge and that is determined depending on the physical property and the charging/discharging state of the rechargeable battery; and a polarization voltage generation constant setting unit for presetting a polarization voltage generation constant (Kpol) that is a change amount of a polarization voltage with respect to a change amount of a charging/discharging electricity amount in a usage region of a state of charge and that is determined depending on the physical property and the charging/discharging state of the rechargeable battery. The estimated charging/discharging electricity amount calculation unit calculates the estimated charging/discharging electricity amount $\Delta$Qe as a function of the zero-current state voltage change amount $\Delta$Vzo and the time-dependent voltage change amount $\Delta$Vbp(th) using the expression of $\Delta$Qe=Kb*($\Delta$Vzo+$\Delta$Vbp(th))/(Keq+Kpol).

A third aspect of the rechargeable battery charging/discharging electricity amount estimation apparatus according to the present invention includes in the first aspect of the rechargeable battery charging/discharging electricity amount estimation apparatus according to the present invention a polarization voltage calculation unit for calculating a polarization voltage of the rechargeable battery based on the estimated charging/discharging electricity amount; a first electromotive force calculation unit for calculating an electromotive force (Veq) of the rechargeable battery based on the zero-current state voltage stored in the zero-current state voltage storage unit and the polarization voltage calculated by the polarization voltage calculation unit; an electromotive force storage unit for storing the electromotive force calculated by the first electromotive force calculation unit; a measured charging/discharging electricity amount calculation unit for calculating a measured charging/discharging electricity amount ($\Delta$Qm) during a period in which the electromotive force is being stored in the electromotive force storage unit from current flowing through the rechargeable battery; a second electromotive force calculation unit for calculating an electromotive force for calculating the estimated charging/discharging electricity amount (Veq2) based on the electromotive force stored in the electromotive force storage unit and the measured charging/discharging electricity amount; and an electromotive force change amount calculation unit for calculating an electromotive force change amount ($\Delta$Veq) that is a difference between the electromotive force for calculating the estimated charging/discharging electricity amount and the electromotive force stored in the electromotive force storage unit. The estimated charging/discharging electricity amount calculation unit calculates the estimated charging/discharging electricity amount based on the electromotive force change amount in addition to the zero-current state voltage change amount.

In this case, the second electromotive force calculation unit calculates, as the electromotive force for calculating the estimated charging/discharging electricity amount (Veq2), an electromotive force corresponding to a state of charge obtained by subtracting or adding the measured charging/discharging electricity amount ($\Delta$Qm) from or to a state of charge corresponding to the electromotive force stored in the electromotive force storage unit by referring to an electromotive force characteristic with respect to a state of charge of the rechargeable battery that is prepared beforehand and is parameterized by a temperature.

The third aspect of the rechargeable battery charging/discharging electricity amount estimation apparatus according to the present invention further includes a voltage change amount adjustment constant-adjustment coefficient setting unit for presetting a voltage change amount adjustment constant ($\Delta$Vbc) and a voltage change amount adjustment coefficient (Kb), which are determined depending on a physical property and a charging/discharging state of the rechargeable battery, for the zero-current state voltage change amount ($\Delta$Vzo); and a polarization voltage generation constant setting unit for presetting a polarization voltage generation constant (Kpol) that is a change amount of a polarization voltage with respect to a charging/discharging electricity amount in a usage region of a state of charge and that is determined depending on the physical property and the charging/discharging state of the rechargeable battery. The estimated charging/discharging electricity amount calculation unit calculates the estimated charging/discharging electricity amount $\Delta$Qe as a function of the zero-current state voltage change amount $\Delta$Vzo, the electromotive force change amount $\Delta$Veq, and the measured charging/discharging electricity amount $\Delta$Qm using the expression of $\Delta$Qe=Kb*($\Delta$Vzo+$\Delta$Vbc)/($\Delta$Veq/$\Delta$Qm+Kpol).

A fourth aspect of the rechargeable battery charging/discharging electricity amount estimation apparatus according to the present invention further includes in the first aspect of the rechargeable battery charging/discharging electricity amount estimation apparatus according to the present invention a polarization voltage calculation unit for calculating a polarization voltage (Vpol) of the rechargeable battery based on the estimated charging/discharging electricity amount; a polarization voltage storage unit for storing the polarization voltage calculated by the polarization voltage calculation unit; a time-dependent voltage change amount calculation unit for calculating a time-dependent voltage change amount ($\Delta$Vbp(th)) based on the polarization voltage stored in the polarization voltage storage unit and a storage time; a first electromotive force calculation unit for calculating an electromotive force (Veq) of the rechargeable battery based on the zero-current state voltage stored in the zero-current state voltage storage unit and the polarization voltage stored in the polarization voltage storage unit; an electromotive force storage unit for storing the electromotive force calculated by the first electromotive force calculation unit; a measured charging/discharging electricity amount calculation unit for calculating a measured charging/discharging electricity amount ($\Delta$Qm) during a period in which the electromotive force is being stored in the electromotive force storage unit from current flowing through the rechargeable battery; a second electromotive force calculation unit for calculating an electromotive force for calculating the estimated charging/discharging electricity amount (Veq2) based on the electromotive force stored in the electromotive force storage unit and the measured charging/discharging electricity amount; and an electromotive force change amount calculation unit for calculating an electromotive force change amount ($\Delta$Veq) that is a difference between the electromotive force for calculating the estimated charging/discharging electricity amount and the electromotive force stored in the electromotive force storage unit. The estimated charging/discharging electricity amount calculation unit calculates the estimated charging/discharging electricity amount based on the time-dependent voltage change amount and the electromotive force change amount in addition to the zero-current state voltage change amount.

In this case, the time-dependent voltage change amount calculation unit calculates the time-dependent voltage change amount by multiplying the polarization voltage stored in the polarization voltage storage unit by a polarization attenuation ratio that is a function of the storage time.

Further, the second electromotive force calculation unit calculates, as the electromotive force for calculating the estimated charging/discharging electricity amount (Veq2), an electromotive force corresponding to a state of charge obtained by subtracting or adding the measured charging/discharging electricity amount ($\Delta Qm$) from or to a state of charge corresponding to the electromotive force stored in the electromotive force storage unit by referring to an electromotive force characteristic with respect to a state of charge of the rechargeable battery that is prepared beforehand and is parameterized by a temperature.

The fourth aspect of the rechargeable battery charging/discharging electricity amount estimation apparatus according to the present invention further includes a voltage change amount adjustment coefficient setting unit for presetting an adjustment coefficient (Kb), which is determined depending on a physical property and a charging/discharging state of the rechargeable battery, for the zero-current state voltage change amount ($\Delta Vzo$); and a polarization voltage generation constant setting unit for presetting a polarization voltage generation constant (Kpol) that is a change amount of a polarization voltage with respect to a charging/discharging electricity amount in a usage area of a state of charge and that is determined depending on the physical property and the charging/discharging state of the rechargeable battery. The estimated charging/discharging electricity amount calculation unit calculates the estimated charging/discharging electricity amount $\Delta Qe$ as a function of the zero-current state voltage change amount $\Delta Vzo$, the time-dependent voltage change amount $\Delta Vbp(th)$, the electromotive force change amount $\Delta Veq$, and the measured charging/discharging electricity amount $\Delta Qm$ using the expression of $\Delta Qe=Kb*(\Delta Vzo+\Delta Vbp(th))/(\Delta Veq/\Delta Qm+Kpol)$.

To achieve the above object, a method for estimating a polarization voltage of a rechargeable battery according to the present invention includes calculating an estimated charging/discharging electricity amount using any one of the first to fourth aspects of the method for estimating a charging/discharging electricity amount of a rechargeable battery; and re-calculating a polarization voltage of the rechargeable battery based on the estimated charging/discharging electricity amount.

To achieve the above object, a method for estimating a state of charge of a rechargeable battery according to the present invention includes calculating an estimated charging/discharging electricity amount using any one of the first to fourth aspects of the method for estimating a charging/discharging electricity amount of a rechargeable battery; and calculating a state of charge of the rechargeable battery based on the estimated charging/discharging electricity amount.

To achieve the above object, an apparatus for estimating a polarization voltage of a rechargeable battery according to the present invention includes a polarization voltage re-calculation unit for re-calculating a polarization voltage of the rechargeable battery based on an estimated charging/discharging electricity amount calculated by any one of the first to fourth aspects of the apparatus for estimating a charging/discharging electricity amount of a rechargeable battery.

To achieve the above object, an apparatus for estimating a state of charge of a rechargeable battery according to the present invention includes a state-of-charge calculation unit for calculating a state of charge of the rechargeable battery based on an estimated charging/discharging electricity amount calculated by any one of the first to fourth aspects of the apparatus for estimating a charging/discharging electricity amount of a rechargeable battery.

According to the present invention, an estimated charging/discharging electricity amount including substantially no current measurement error is calculated based on a measured voltage involving little influence from current measurement error (a zero-current state voltage calculated from a no-load voltage or an open-circuit voltage), and a polarization voltage and an SOC that are not influenced by a current measurement error are calculated using the estimated charging/discharging electricity amount. This improves the precision of SOC estimation, and enables a battery to undergo SOC management that executes protection control and prolongs the life of the battery.

DESCRIPTION OF REFERENCE NUMBERS 1A, 1B, 1C, 1D Battery Pack System
100 Battery Pack
101A, 101B, 101C, 101D, Battery ECU (Charging/Discharging Electricity amount Estimation Apparatus, Polarization Voltage Estimation Apparatus, SOC Estimation Apparatus)
102 Voltage Measurement Unit
103 Current Measurement Unit
104 Temperature Measurement Unit
105 No-load Voltage Calculation Unit
106 Open-Circuit Voltage Calculation Unit
107 Zero-Current State Voltage Calculation Unit
108 Zero-Current State Voltage Storage Unit
109 Zero-current State Voltage Change Amount Calculation Unit
110 Polarization Voltage Calculation Unit
1101 Lookup table (LUT)
111 Polarization Voltage Storage Unit
1111 Timer
112 Time-Dependent Voltage Change Amount Calculation Unit
113 First Electromotive Force Calculation Unit
114 Electromotive Force Storage Unit
115 Measured Charging/Discharging Electricity amount Calculation Unit
116 Second Electromotive Force Calculation Unit
1161 Lookup Table (LUT)
117 Electromotive Force Change Amount Calculation Unit
118A, 118B, 118C, 118D Estimated Charging/Discharging Electricity amount Calculation Unit
119 SOC Calculation Unit
120 Polarization Voltage Re-calculation Unit
1201 Lookup Table (LUT)
121 Voltage Change Amount Adjustment Constant (ΔVbc)-Adjustment Coefficient (Kb) Setting Unit
1211 Lookup Table (LUT)
122 Electromotive Force Change Constant (Keq) Setting Unit
1221 Lookup Table (LUT)
123 Polarization Voltage Generation Constant (Kpol) Setting Unit
1231 Lookup Table (LUT)
124 Voltage Change Amount Adjustment Coefficient (Kb) Setting Unit

DETAILED DESCRIPTION OF THE PREFERRED EMBODIMENTS

Preferred embodiments of the present invention will now be described with reference to the drawings.

First Embodiment

Figure 1:
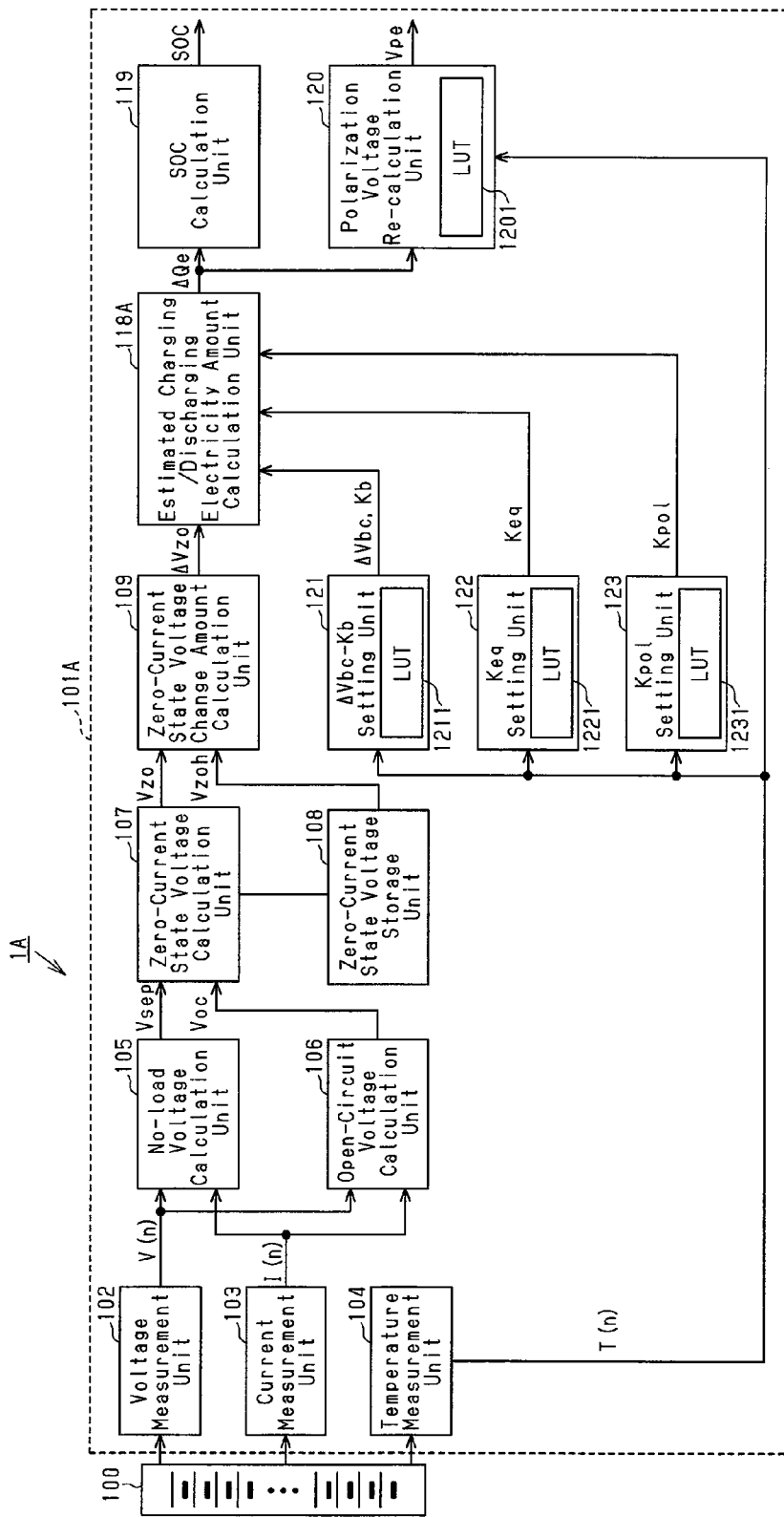
FIG. 1 is a block diagram showing an example structure for a battery pack system according to a first embodiment of the present invention.

FIG. 1 is a block diagram showing an example structure for a battery pack system according to a first embodiment of the present invention. In FIG. 1, a battery pack system 1A includes a battery pack 100 and a battery ECU 101A including an SOC estimation apparatus of the present invention which is part of a microcomputer system.

The battery pack 100, mounted for example on an HEV, is formed by a plurality of battery blocks that are electrically connected in series. Each battery block is formed by a plurality of cells or battery modules, e.g., nickel-metal hydride batteries, which are electrically connected in series in order to obtain a predetermined output to a motor.

The battery ECU 101A includes a voltage measurement unit 102 for measuring a terminal voltage for each battery block in the battery pack 100 detected by a voltage sensor (not shown) in predetermined sampling cycles as voltage data V(n), a current measurement unit 103 for measuring a charging/discharging current of the battery pack 100 detected by a current sensor (not shown) in predetermined sampling cycles as current data I(n) (the sign of which indicates either the charging direction or the discharging direction), and a temperature measurement unit 104 for measuring the temperature of each battery block in the battery pack 100 detected by a temperature sensor (not shown) as temperature data T(n).

The voltage data V(n) from the voltage measurement unit 102 and the current data I(n) from the current measurement unit 103 are input as a data set into a no-load voltage calculation unit 105. The no-load voltage calculation unit 105 determines that the data set of voltage data V(n) and current data I(n) is an effective data set when a specific selection condition is satisfied, that is, the value of the current data I(n) in the charging direction (−) and the discharging direction (+) is within a predetermined range (e.g., ±50 A), there is at least a predetermined number of current data I(n) in the charging direction and the discharging direction (e.g., ten pieces of data in each direction being included in 60 samples), and the charging/discharging electricity amount during which the data set is being obtained is within a predetermined range (e.g., 0.3 Ah).

Next, the no-load voltage calculation unit 105 obtains a linear voltage-current line (approximate line) from the effective data sets by performing statistical processing such as regression analysis using a least-square method or the like to calculate a no-load voltage Vsep, which is a voltage value (voltage intercept) in a zero-current state.

The voltage data V(n) and the current data I(n) are also input into an open-circuit voltage calculation unit 106. When a specific current condition (e.g., an absolute value of the current data I(n) is less than 10 A) or a specific voltage condition (e.g., a change amount of the voltage data V(n) is less than 1 V) is satisfied continuously for a certain period of time (e.g., for 10 seconds), the open-circuit voltage calculation unit 106 adds a value obtained by multiplying a component resistance Rcom by an average value Iave of the current data I(n) to an average value Vave of the voltage data V(n) of each battery block to correct a voltage drop caused by a component resistor and calculate an open-circuit voltage Voc (Voc=Vave+Rcom*Iave)

The no-load voltage Vsep from the no-load voltage calculation unit 105 and the open-circuit voltage Voc from the open-circuit voltage calculation unit 106 are input into a zero-current state voltage calculation unit 107. The zero-current state voltage calculation unit 107 determines that the calculation accuracy is sufficiently high and selects the no-load voltage Vsep when the above selection condition is satisfied. The zero-current state voltage calculation unit 107 also determines that the calculation accuracy is sufficiently high and selects the open-circuit voltage Voc when the selection condition is not satisfied but the above current condition or voltage condition is satisfied continuously for a certain period of time and outputs the selected voltage as a zero-current state voltage Vzo. When none of the conditions is satisfied, the zero-current state voltage Vzo is not calculated. This structure ensures a sufficiently high calculation accuracy of the zero-current state voltage Vzo.

The zero-current state voltage Vzo from the zero-current state voltage calculation unit 107 is input into a zero-current state voltage storage unit 108, where it is stored as a voltage Vzoh.

A zero-current state voltage Vzo calculated subsequently by the zero-current state voltage calculation unit 107 and the zero-current state voltage Vzoh stored in the zero-current state voltage storage unit 108 are input into a zero-current state voltage change amount calculation unit 109, where an amount of change by which the zero-current state voltage Vzo changes from the stored zero-current state voltage Vzoh (zero-current state voltage change amount) $\Delta Vzo$ is calculated. Here, the voltage change amount is not calculated as an amount of voltage change occurring in a predetermined time. The zero-current state voltage that is calculated is stored, and an amount of voltage change occurring between the stored zero-current state voltage and the subsequently calculated zero-current state voltage is calculated. This reduces failures in the calculation of the voltage change amount when the no-load voltage Vsep and the open-circuit voltage Voc cannot be obtained.

A voltage change amount adjustment constant ($\Delta Vbc$)-adjustment coefficient (Kb) setting unit 121 presets a voltage change amount adjustment constant $\Delta Vbc$ and a voltage change amount adjustment coefficient Kb by referring to a lookup table (LUT) 1211 prestoring values of the voltage change amount adjustment constant $\Delta Vbc$ and the voltage change amount adjustment coefficient Kb parameterized by a temperature in a manner that the values depend on polarization characteristics determined by the physical properties of the rechargeable battery or voltage attenuation characteristics determined by the charging/discharging (usage) state of the rechargeable battery. For example, the LUT 1211 stores 0.01 V as a value of the voltage change amount adjustment constant $\Delta Vbc$ corresponding to a temperature of 25° C. The adjustment coefficient Kb is a coefficient that is appropriately set in accordance with an actual system.

An electromotive force change constant (Keq) setting unit 122 presets an electromotive force change constant Keq based on temperature data T(n) measured by the temperature measurement unit 104 by referring to a lookup table (LUT) 1211. More specifically, the electromotive force change constant setting unit 122 refers to the inclination of the characteristic curve of values of the electromotive force change constant Keq with respect to values of the charging (or discharging) current amount in an SOC usage region (e.g., in an SOC range of 20 to 80%) prestored in the LUT 1221 and parameterized by a temperature in a manner that the values depend on the physical properties or charging/discharging (usage) state of the rechargeable battery. For example, the LUT 1211 stores 0.1 V/Ah as a value of the electromotive force change constant Keq corresponding to a temperature of 25° C.

A polarization voltage generation constant (Kpol) setting unit 123 presets a polarization voltage generation constant Kpol based on temperature data T(n) measured by the temperature measurement unit 104 by referring to a lookup table (LUT) 1231. More specifically, the polarization voltage generation constant setting unit 123 refers to the inclination of the characteristic curve of values of the polarization voltage generation constant Kpol with respect to values of the charging (or discharging) current amount prestored in the LUT 1231 and parameterized by a temperature in a manner that the values depend on the physical properties or charging/discharging (usage) state of the rechargeable battery. For example, the LUT 1231 stores 0.1 V/Ah as a value of the polarization voltage generation constant Kpol corresponding to a temperature of 25° C. and an SOC of 60%.

The zero-current state voltage change amount $\Delta Vzo$ from the zero-current state voltage change amount calculation unit 109, the voltage change amount adjustment constant $\Delta Vbc$ and the voltage change amount adjustment coefficient Kb from the voltage change amount adjustment constant-adjustment coefficient setting unit 121, the electromotive force change constant Keq from the electromotive force change constant setting unit 122, the polarization voltage generation constant Kpol from the polarization voltage generation constant setting unit 123 are input into an estimated charging/discharging electricity amount calculation unit 118A. The estimated charging/discharging electricity amount calculation unit 118A calculates an estimated charging/discharging electricity amount $\Delta Qe$ as a function of the zero-current state voltage change amount $\Delta Vzo$ using the following expression.

$$\Delta Qe = Kb^*(\Delta Vzo + \Delta Vbc)/(Keq + Kpol)$$

Here, the zero-current state voltage Vzo obtained from the no-load voltage Vsep or the open-circuit voltage Voc is not used but the zero-current state voltage change amount $\Delta Vzo$ is used to calculate the estimated charging/discharging electricity amount $\Delta Qe$ during a predetermined period from when the voltage Vzo is calculated once to when the voltage Vzo is calculated subsequently. The reason for using the zero-current state voltage change amount $\Delta Vzo$ instead of the zero-current state voltage Vzo is as follows. The no-load voltage Vsep or the open-circuit voltage Voc is modeled as being formed by elements including an electromotive force element and a polarization voltage element. The electromotive force element and the polarization voltage element change in a manner dependent on the charging/discharging electricity amount. Thus, the estimated charging/discharging electricity amount $\Delta Qe$ can be calculated from the zero-current state voltage change amount $\Delta Vzo$. Further, the reason why the voltage change amount adjustment constant $\Delta Vbc$ is added to the zero-current state voltage change amount $\Delta Vzo$ in the expression for calculating the estimated charging/discharging electricity amount $\Delta Qe$ is that a polarization generated during a predetermined period attenuates and the addition corrects the attenuation amount of polarization.

The estimated charging/discharging electricity amount $\Delta Qe$ is input into a polarization voltage re-calculation unit 120. The polarization voltage re-calculation unit 120 re-calculates the polarization voltage Vpe based on temperature data T(n) measured by the temperature measurement unit 104 by referring to a lookup table (LUT) 1201. More specifically, the polarization voltage re-calculation unit 120 refers to the characteristic curve or expression of values of the polarization voltage Vpe with respect to values of the estimated charging/discharging electricity amount $\Delta Qe$ prestored in the LUT 1201 and parameterized by a temperature.

Further, the estimated charging/discharging electricity amount $\Delta Qe$ is input into an SOC calculation unit 119, where the SOC of each battery block in the battery pack 100 is calculated using the polarization voltage Vpe etc. based on the estimated charging/discharging electricity amount $\Delta Qe$.

In the present embodiment, the charging/discharging electricity amount is not calculated by integrating the measured current as in the prior art example, but the charging/discharging electricity amount $\Delta Qe$ is calculated as a function of the zero-current state voltage that involves little influence of a current measurement error. This improves the calculation accuracy of the polarization voltage and the SOC.

The processing procedures for estimating the SOC and the polarization voltage in the battery pack system with the above-described structure of the present embodiment will now be described with reference to FIG. 2.

Figure 2:
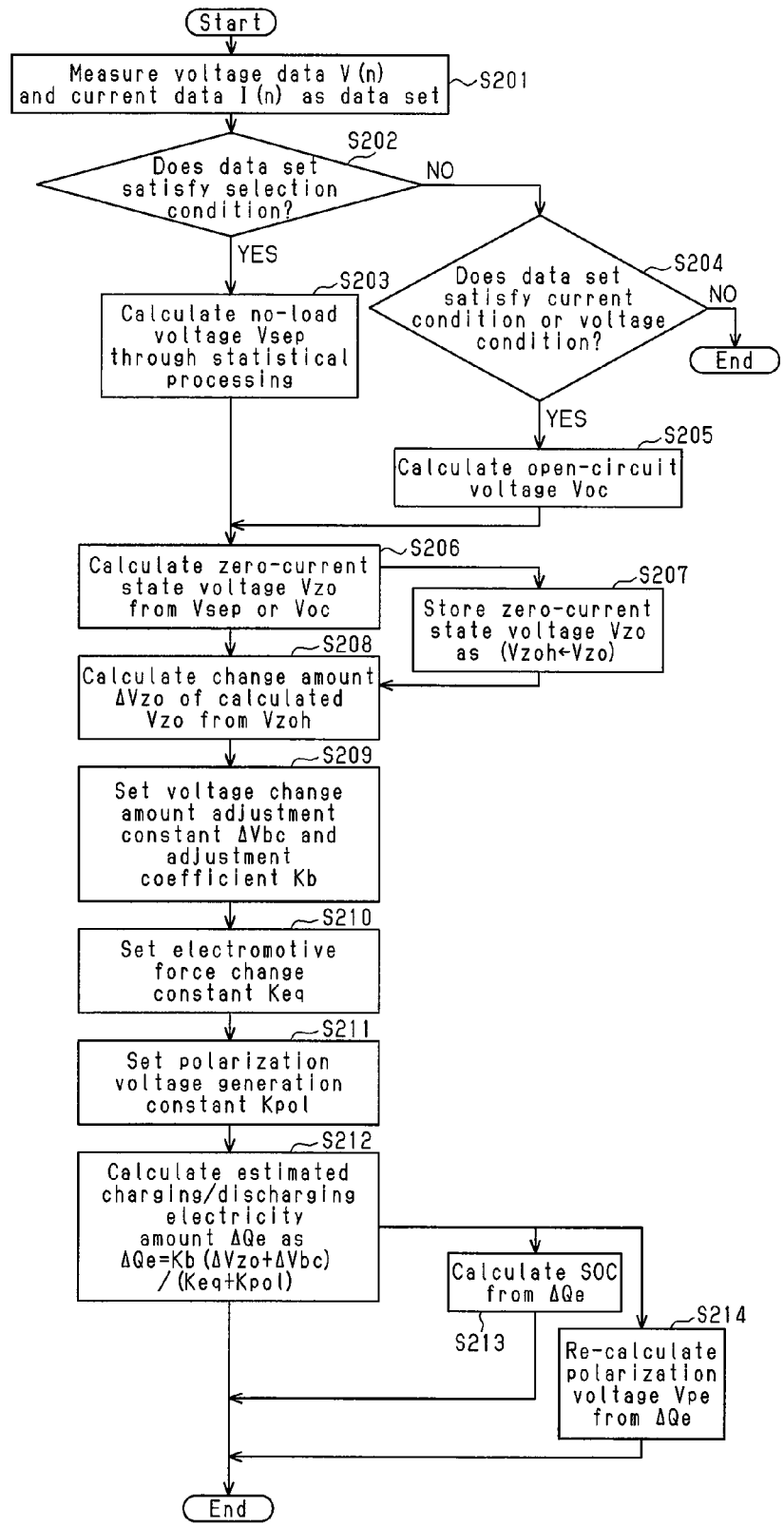
FIG. 2 is a flowchart showing the processing procedures for an SOC estimation method and a polarization voltage estimation method including a charging/discharging electricity amount estimation method for a rechargeable battery according to the first embodiment.

FIG. 2 is a flowchart showing the processing procedures for an SOC estimation method and a polarization voltage estimation method including a rechargeable battery charging/discharging electricity amount estimation method according to the first embodiment. In FIG. 2, voltage data V(n) and current data I(n) are first measured as a data set (step S201). Next, determination is performed as to whether the data set of voltage data V(n) and current data I(n) measured in step S201 satisfies the specific selection condition described above to examine whether the data set is an effective data set (step S202). When the data set satisfies the specific selection condition in the determination of step S202 (Yes), the processing proceeds to step S203, where a plurality of effective data sets are obtained (e.g., ten data sets in each of the charging/discharging directions are obtained from 60 samples), a linear approximate line (V-I line) is obtained from the effective data sets through statistical processing such as regression analysis using a least-square method or the like, and the V-intercept of the approximate line is calculated as the no-load voltage Vsep. Next, the zero-current state voltage Vzo is calculated from the calculated no-load voltage Vsep (step S206), and is stored as the voltage Vzoh (Vzoh←Vzo: step S207).

When the data set does not satisfy the specific selection condition in the determination of step S202 (No), the processing proceeds to step S204 to determine whether the data set satisfies the specific current condition or voltage condition described above continuously for a certain period of time. When the data set satisfies the specific current condition (e.g., when the absolute value of the current data I(n) is less than 10 A continuously for 10 seconds) (Yes) or satisfies the voltage condition (e.g., when the change amount of the voltage data V(n) is less than 1 V continuously for 10 seconds) in the determination of step S204 (Yes), the processing proceeds to step S205, where the value obtained by multiplying the average value Iave of the current data I(n) by the component resistance Rcom is added to the average value Vave of the voltage data V(n) of each battery block during that time to correct the voltage drop caused by the component resistor and calculate the open-circuit voltage Voc (Voc=Vave+Rcom*Iave). Next, the zero-current state voltage Vzo is calculated from the calculated open-circuit voltage Voc (step S206) and stored as the voltage Vzoh (Vzoh←Vzo: step S207).

When the data set does not satisfy the specific current condition and the voltage condition in the determination of step S204 (No), this routine is ended and the processing is terminated.

The change amount (zero-current state current change amount) ΔVzo by which the voltage Vzo calculated in step S206 in the subsequent interrupt processing changes from the zero-current state voltage Vzoh stored in step S207 is calculated (step S208).

Next, the voltage change amount adjustment constant ΔVbc and the voltage change amount adjustment coefficient Kb, the electromotive force change constant Keq, and the polarization voltage generation constant Kpol are preset (steps S209, S210 and S211), and the estimated charging/discharging electricity amount ΔQe is calculated as a function of the zero-current state voltage change amount ΔVzo using the expression ΔQe=Kb*(ΔVzo+ΔVbc)/(Keq+Kpol) (step S212).

Further, because the polarization voltage is a value dependent on the history of charging/discharging operations of the battery, the polarization voltage is re-calculated from the estimated charging/discharging electricity amount ΔQe (step S214).

Further, the SOC is calculated using the polarization voltage Vpe etc. based on the estimated charging/discharging electricity amount ΔQe calculated in this manner (step S213).

As described above, the state-of-charge SOC and the polarization voltage Vpe of each battery block in the battery pack 100 are estimated.

Although the linear function expression of the zero-current state voltage change amount ΔVzo is used to calculate the estimated charging/discharging electricity amount ΔQe in the present embodiment, an N degree function expression (N is a natural number) or an exponential function expression may be used instead.

Second Embodiment

Figure 3:
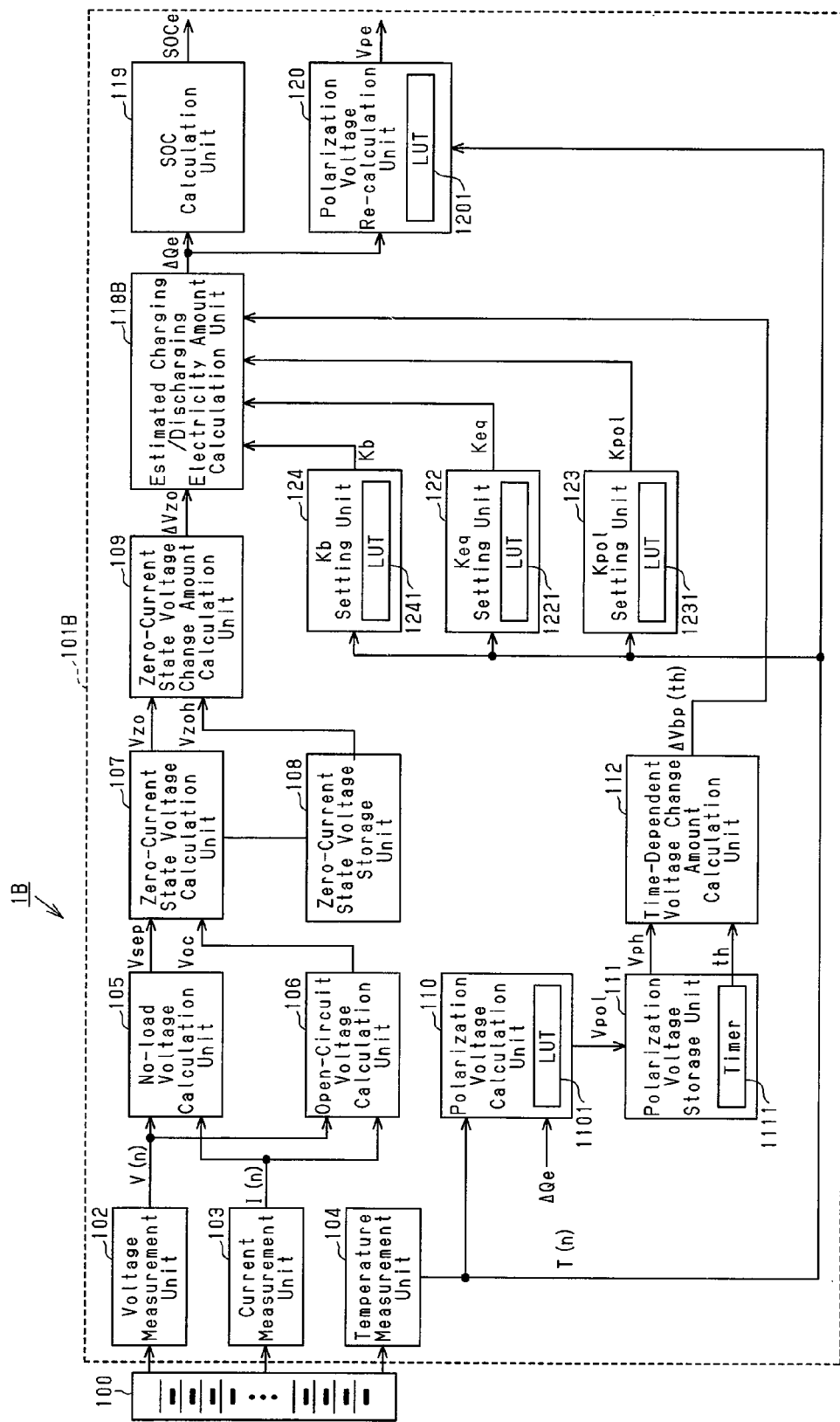
FIG. 3 is a block diagram showing an example structure of a battery pack system according to a second embodiment of the present invention.

FIG. 3 is a block diagram showing an example structure of a battery pack system 1B according to a second embodiment of the present invention. In FIG. 3, the components having the same structure and functions as the components of the first embodiment illustrated in FIG. 1 will be given the same reference numbers as those components and will not be described.

A battery ECU 1B of the present embodiment calculates an estimated charging/discharging electricity amount ΔQe not only by using a zero-current state voltage change amount ΔVzo as in the first embodiment but also by obtaining a time-dependent voltage change amount ΔVbp(th) from a stored polarization voltage Vph and a storage time th and using the time-dependent voltage change amount ΔVbp(th) instead of using a voltage change amount adjustment coefficient ΔVbc.

In FIG. 3, an estimated charging/discharging electricity amount ΔQe from an estimated charging/discharging electricity amount calculation unit 118B is input into a polarization voltage calculation unit 110. The polarization voltage calculation unit 110 calculates a polarization voltage Vpol based on temperature data T(n) measured by a temperature measurement unit 104 by referring to a lookup table (LUT) 1101. More specifically, the polarization voltage calculation unit 110 refers to the characteristic curve or expression of values of the polarization voltage Vpol with respect to values of the estimated charging/discharging electricity amount ΔQe prestored in the LUT 1101 and parameterized by a temperature.

Figure 4:
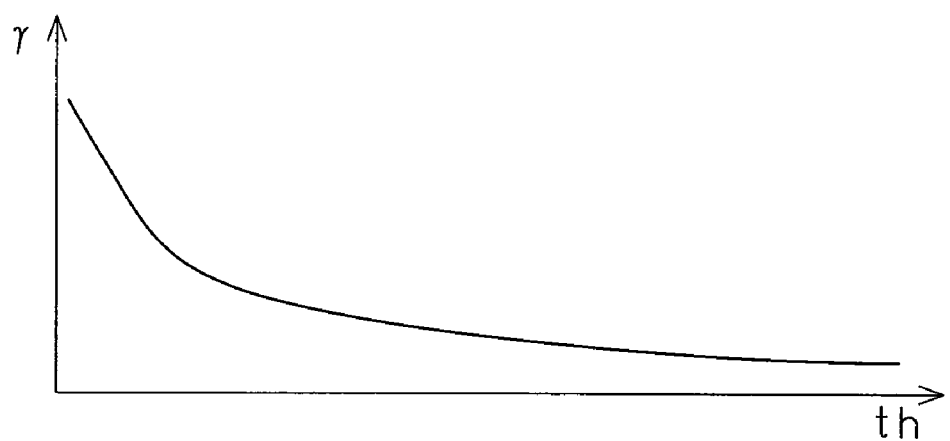
FIG. 4 is a graph showing a polarization voltage attenuation ratio γ that is a function of a storage time th of a polarization voltage used to calculate a time-dependent voltage change amount $\Delta Vbp(th)$.

The polarization voltage Vpol from the polarization voltage calculation unit 110 is input into a polarization voltage storage unit 111 and is stored as a voltage Vph, and its storage time th is counted by a timer 1111. The polarization voltage Vph stored in the polarization voltage storage unit 111 and the storage time th counted by the timer 1111 are input into a time-dependent voltage change amount calculation unit 112, where the stored polarization voltage Vph is multiplied by a polarization voltage attenuation ratio γ(th) that is a function of the storage time th shown in FIG. 4 to calculate a time-dependent voltage change amount ΔVbp(th).

A zero-current state voltage change amount ΔVzo from a zero-current state voltage change amount calculation unit 109, the time-dependent voltage change amount ΔVbp(th) from the time-dependent voltage change amount calculation unit 112, a voltage change amount adjustment coefficient Kb from a voltage change amount adjustment coefficient setting unit 124, an electromotive force change coefficient Keq from an electromotive force change coefficient setting unit 122, and a polarization voltage generation constant Kpol from a polarization voltage generation constant setting unit 123 are input into an estimated charging/discharging electricity amount calculation unit 118B. The estimated charging/discharging electricity amount calculation unit 118B calculates an estimated charging/discharging electricity amount ΔQe as a function of the zero-current state voltage change amount ΔVzo and the time-dependent voltage change amount ΔVbp (th) using the following expression.

$$\Delta Qe = Kb * (\Delta Vzo + \Delta Vbp(th))/(Keq + Kpol)$$

The remaining structure and functions are the same as in the first embodiment.

In the present embodiment, the time-dependent voltage change amount ΔVbp(th) is used instead of the voltage change amount adjustment coefficient ΔVbc. This improves the calculation accuracy of the estimated charging/discharging electricity amount ΔQe as compared with the first embodiment.

Figure 5:
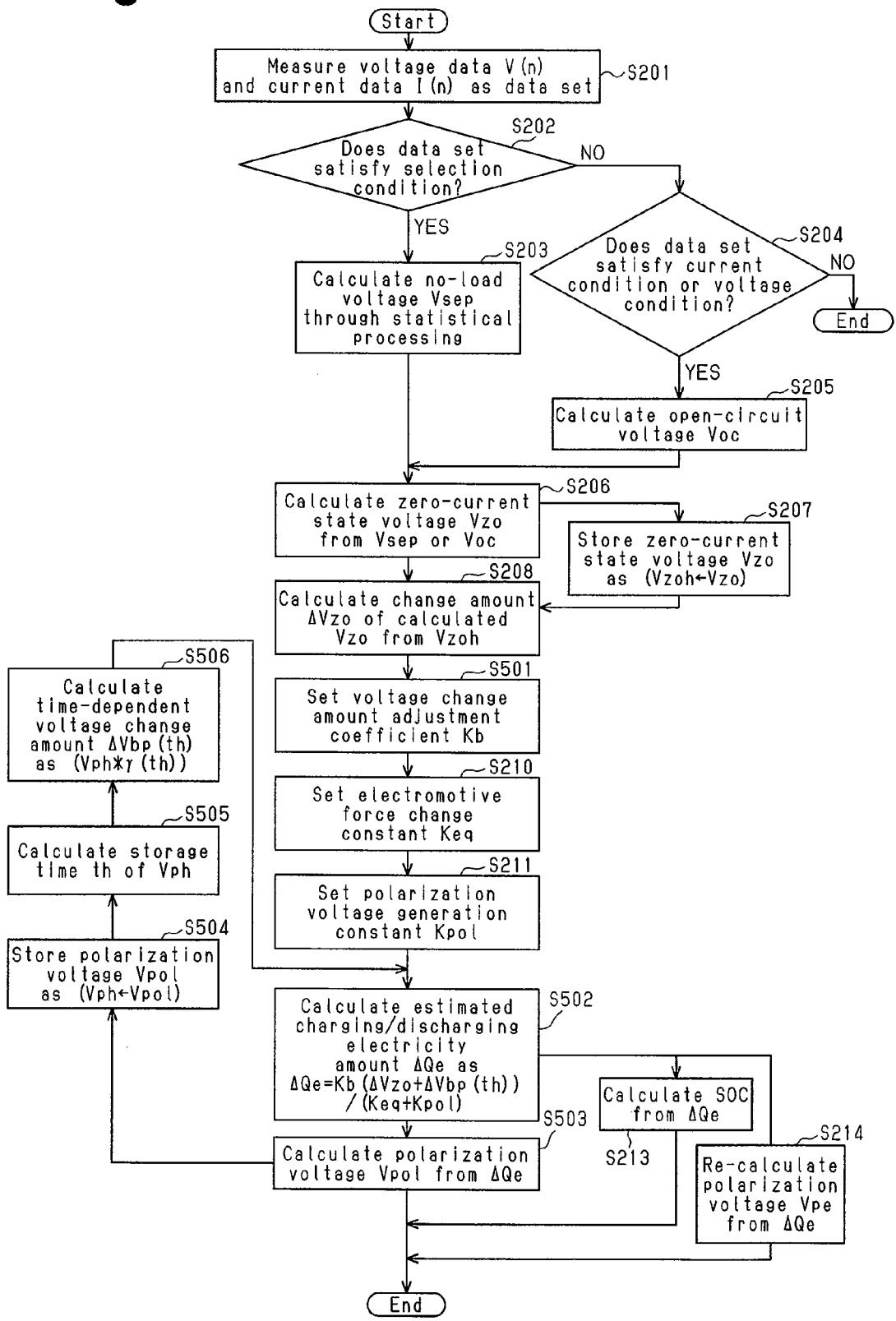
FIG. 5 is a flowchart showing the processing procedures for an SOC estimation method and a polarization voltage estimation method including a charging/discharging electricity amount estimation method for a rechargeable battery according to the second embodiment.

FIG. 5 is a flowchart showing the processing procedures for an SOC estimation method and a polarization voltage estimation method including a rechargeable battery charging/discharging electricity amount estimation method according to the second embodiment. In FIG. 5, the steps that are the same as the steps of the first embodiment illustrated in FIG. 2 will be given the same reference numbers as those steps and will not be described.

The voltage change amount adjustment coefficient Kb, the electromotive force change constant Keq, and the polarization voltage generation constant Kpol are preset (steps S501, S210, and S211), and the estimated charging/discharging electricity amount ΔQe is calculated as a function of the zero-current state voltage change amount ΔVzo and the time-dependent voltage change amount ΔVbp(th) using the time-dependent voltage change amount ΔVbp(th) that has been previously calculated in a loop, which will be described later, and stored. The calculation uses the expression ΔQe=Kb*(ΔVzo+ΔVbp(th))/(Keq+Kpol) (step S502).

Next, the polarization voltage Vpol is calculated based on the estimated charging/discharging electricity amount ΔQe calculated previously in step S502 (step S503). The calculated polarization voltage Vpol is stored as the voltage Vph, and its storage time th is calculated (step S505). Next, the stored polarization voltage Vph is multiplied by the polarization voltage attenuation ratio γ(th) that is a function of the storage time th to calculate the time-dependent voltage change amount ΔVbp(th) (step S506). The time-dependent voltage change amount ΔVbp(th) calculated in this manner is used to subsequently calculate the estimated charging/discharging electricity amount ΔQe in step S502.

The remaining part of the processing procedures is the same as in the first embodiment.

Third Embodiment

Figure 6:
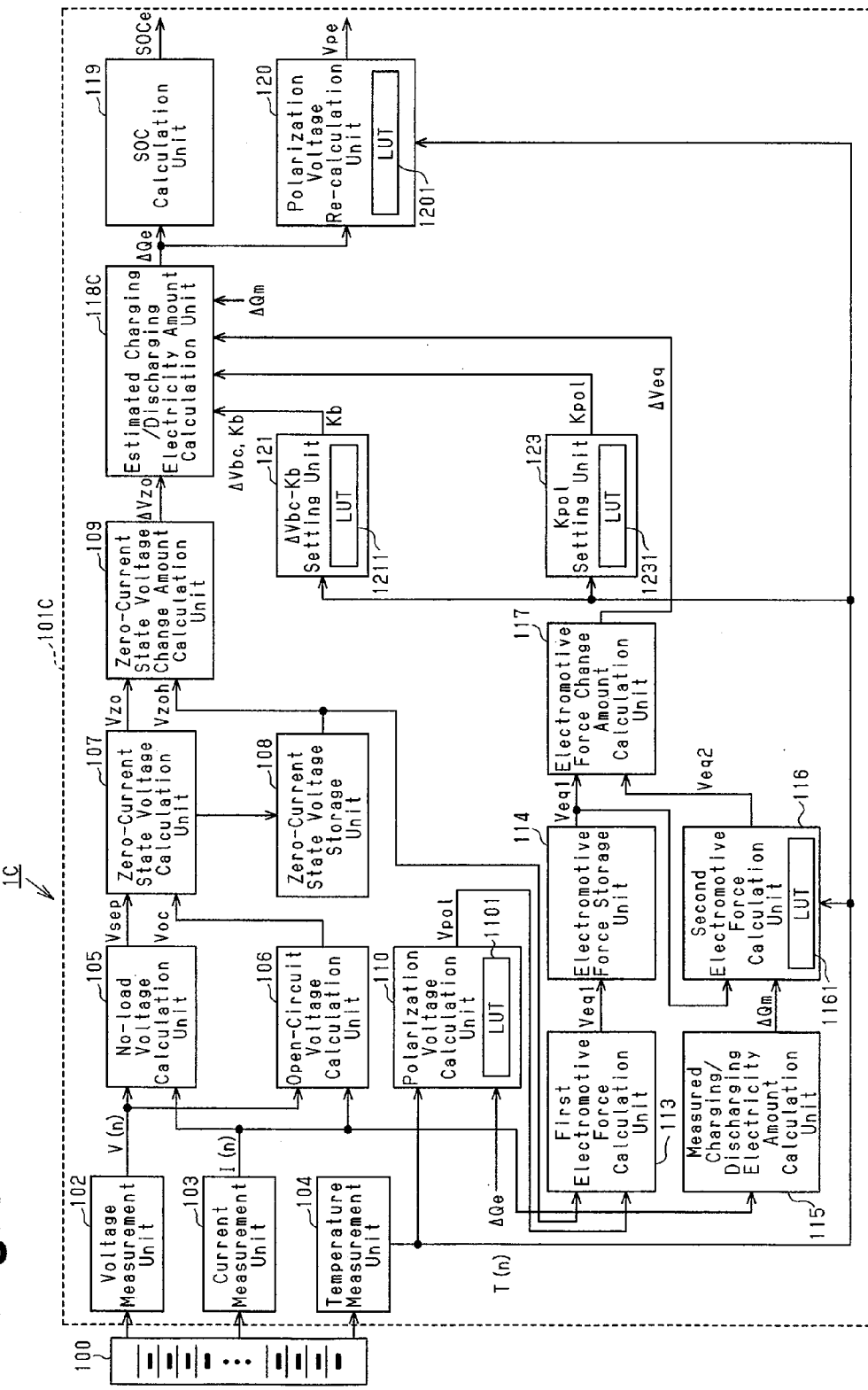
FIG. 6 is a block diagram showing an example structure of a battery pack system according to a third embodiment of the present invention.

FIG. 6 is a block diagram showing an example structure of a battery pack system 1C according to a third embodiment of the present invention. In FIG. 6, the components having the same structure and functions as the components of the first and second embodiments illustrated in FIGS. 1 and 3 will be given the same reference numbers as those components and will not be described.

A battery ECU 1C of the present embodiment calculates an estimated charging/discharging electricity amount ΔQe not only by using a zero-current state voltage change amount ΔVzo as in the first embodiment but also by calculating an electromotive force Veq1 from a zero-current state voltage Vzo and a polarization voltage Vpol, obtaining an electromotive force change amount ΔVeq from a stored electromotive force Veq1, and using a value obtained by dividing an electromotive force change coefficient ΔVeq by a measured charging/discharging electricity amount ΔQm obtained from current data I(n) instead of using an electromotive force change coefficient Keq.

In FIG. 6, a polarization voltage Vpol from a polarization voltage calculation unit 110 and a zero-current state voltage Vzoh stored in a zero-current state voltage storage unit 108 are input into a first electromotive force calculation unit 113. Here, the polarization voltage Vpol is subtracted from the stored zero-current state voltage Vzoh to calculate a first electromotive force Veq1. The first electromotive force Veq1 is stored in an electromotive force storage unit 114.

Further, current data I(n) from a current measurement unit 103 is input into a measured charging/discharging electricity amount calculation unit 115, where the current data I(n) is integrated to calculate a measured charging/discharging electricity amount ΔQm. The measured charging/discharging electricity amount ΔQm from the measured charging/discharging electricity amount calculation unit 115 and an electromotive force Veq1 stored in the electromotive force storage unit 114 are input into a second electromotive force calculation unit 116.

The second electromotive force calculation unit 116 calculates a second electromotive force Veq2, which is an electromotive force for calculating an estimated charging/discharging electricity amount, based on temperature data T(n) measured by a temperature measurement unit 104 by referring to a lookup table (LUT) 1161. More specifically, the second electromotive force calculation unit 116 refers to the characteristic curve or expression of values of the electromotive force Veq with respect to values of the SOC prestored in the LUT 1161 and parameterized by a temperature. The second electromotive force Veq2 is calculated by calculating an electromotive force corresponding to an SOC obtained by adding or subtracting the measured charging/discharging electricity amount ΔQm to or from the SOC corresponding to the stored first electromotive force Veq1 as shown in the graph in FIG. 7.

Figure 7:
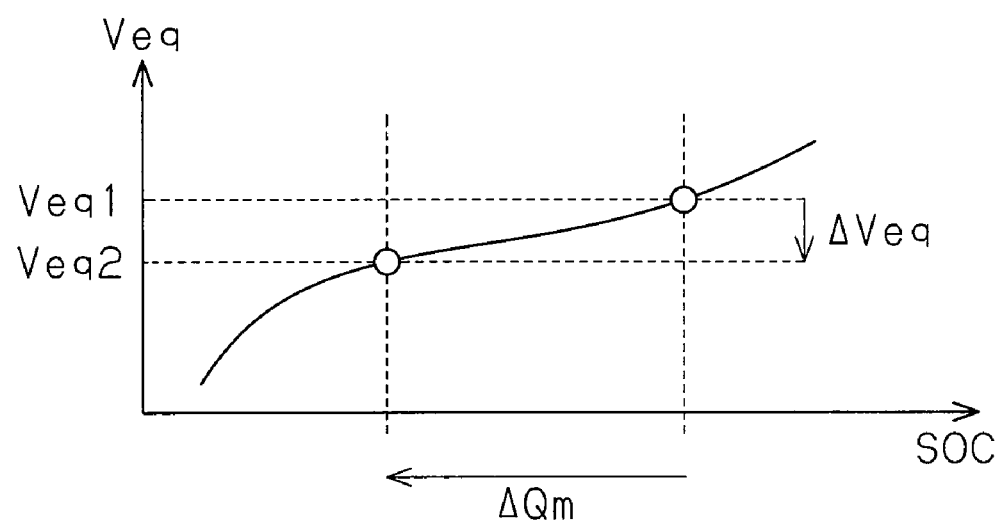
FIG. 7 is a graph showing electromotive force Veq-state-of-charge SOC characteristics used to calculate an electromotive force change amount $\Delta Veq$ from a stored electromotive force (first electromotive force Veq1) and an electromotive force for calculating the estimated charging/discharging electricity amount (second electromotive force Veq2) obtained from a measured charging/discharging electricity amount $\Delta Qm$.

The first electromotive force Veq1 stored in the electromotive force storage unit 114 and the second electromotive force Veq2 from the second electromotive force calculation unit 116 are input into an electromotive force change amount calculation unit 117, where a difference between the first electromotive force Veq1 and the second electromotive force Veq2 is calculated as an electromotive force change amount ΔVeq as shown in the graph in FIG. 7.

A zero-current state voltage change amount ΔVzo from a zero-current state voltage change amount calculation unit 109, a voltage change amount adjustment constant ΔVbc and a voltage change amount adjustment coefficient Kb from a voltage change amount adjustment constant-adjustment coefficient setting unit 121, a polarization voltage generation constant Kpol from a polarization voltage generation constant setting unit 123, an electromotive force change amount ΔVeq from an electromotive force change amount calculation unit 117, and a measured charging/discharging electricity amount ΔQm from a measured charging/discharging electricity amount calculation unit 115 are input into an estimated charging/discharging electricity amount calculation unit 118C. The estimated charging/discharging electricity amount calculation unit 118C calculates the estimated charging/discharging electricity amount ΔQe as a function of the zero-current state voltage change amount ΔVzo, the electromotive force change amount ΔVeq, and the measured charging/discharging electricity amount ΔQm using the following expression.

$$\Delta Qe = Kb^*(\Delta Vzo + \Delta Vbc)/(\Delta Veq/\Delta Qm + Kpol)$$

The remaining structure and functions are the same as in the first embodiment.

In the present embodiment, the estimated charging/discharging electricity amount ΔQe is calculated from the electromotive force change amount according to the voltage change amount (ΔVzo+ΔVbc). This improves the calculation accuracy of the estimated charging/discharging electricity amount ΔQe as compared with the first embodiment.

The processing procedures for estimating the SOC and the polarization voltage in the battery pack system with the above-described structure of the present embodiment will now be described with reference to FIG. 8.

Figure 8:
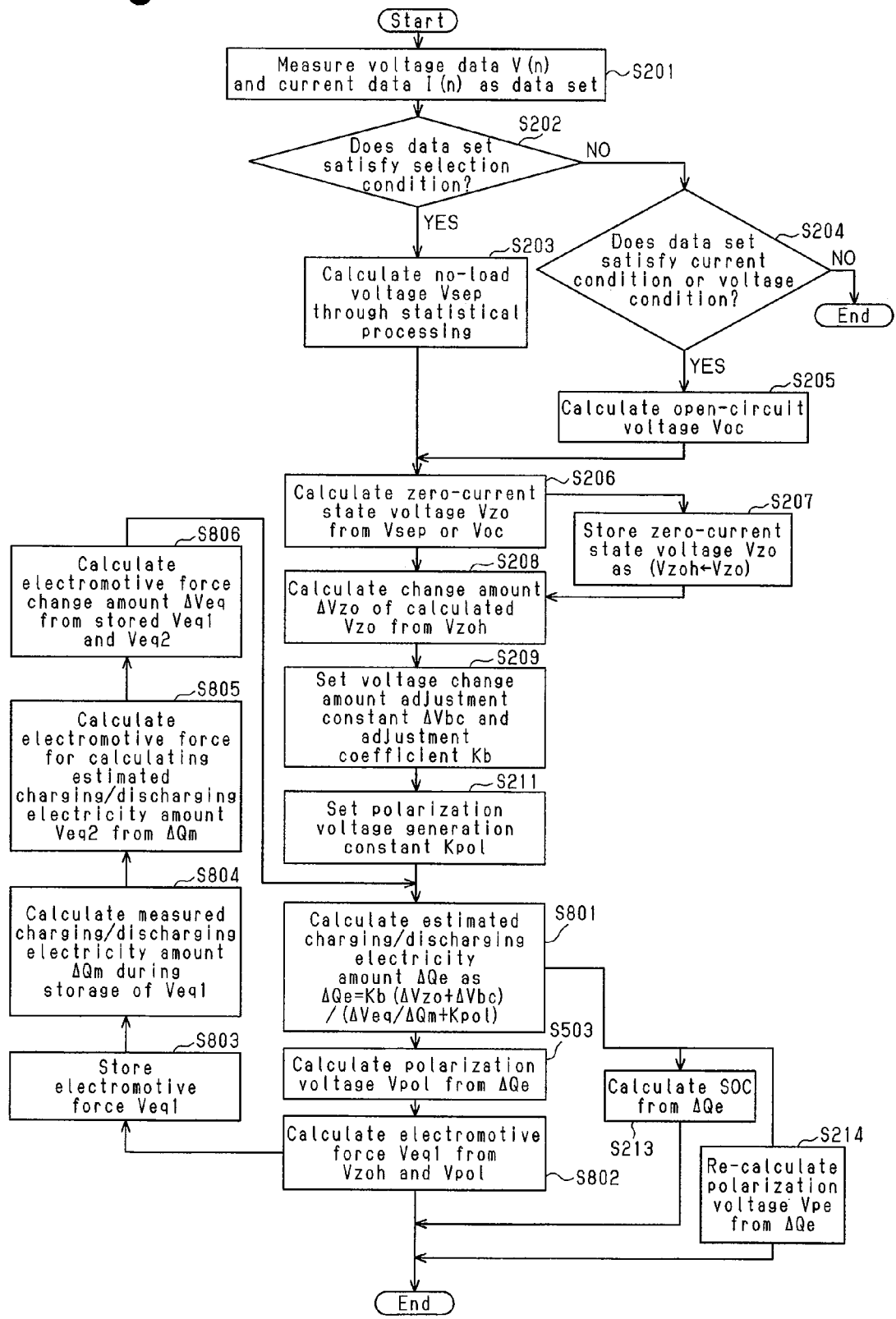
FIG. 8 is a flowchart showing the processing procedures for an SOC estimation method and a polarization voltage estimation method including a charging/discharging electricity amount estimation method for a rechargeable battery according to the third embodiment.

FIG. 8 is a flowchart showing the processing procedures for an SOC estimation method and a polarization voltage estimation method including a rechargeable battery charging/discharging electricity amount estimation method according to the third embodiment. In FIG. 8, the steps that are the same as the steps of the first and second embodiments illustrated in FIGS. 2 and 5 will be given the same reference numbers as those steps and will not be described.

The voltage change amount adjustment coefficient ΔVbc, the voltage change amount adjustment coefficient Kb, and the polarization voltage generation constant Kpol are preset (steps S209 and S211), and the estimated charging/discharging electricity amount ΔQe is calculated as a function of the zero-current state voltage change amount ΔVzo, the electromotive force change amount ΔVeq, and the measured charging/discharging electricity amount ΔQm using the electromotive force change amount ΔVeq and the measured charging/discharging electricity amount ΔQm that have been previously calculated in a loop, which will be described later, and have been stored. The calculation uses the expression ΔQe=Kb*(ΔVzo+ΔVbc)/(ΔVeq/ΔQm+Kpol) (step S801).

Next, the polarization voltage Vpol is calculated based on the estimated charging/discharging electricity amount ΔQe previously calculated in step S502 (step S503). The polarization voltage Vpol is subtracted from the stored zero-current state voltage Vzoh to calculate the first electromotive force Veq1 (step S802). Next, the calculated first electromotive force Veq1 is stored (step S803), and the measured charging/discharging electricity amount ΔQm during when the first electromotive force Veq1 is being stored is calculated (step S804). The second electromotive force, which is as an electromotive force for calculating an estimated charging/discharging electricity amount, is calculated from the measured charging/discharging electricity amount ΔQm as shown in the graph in FIG. 7 (step S805), and a difference between the first electromotive force Veq1 and the second electromotive force Veq2 is calculated as the electromotive force change amount ΔVeq (step S806). The electromotive force change amount ΔVeq calculated in this manner is used to subsequently calculate the estimated charging/discharging electricity amount ΔQe in step S801.

The remaining part of the processing procedures is the same as in the first embodiment.

Fourth Embodiment

Figure 9:
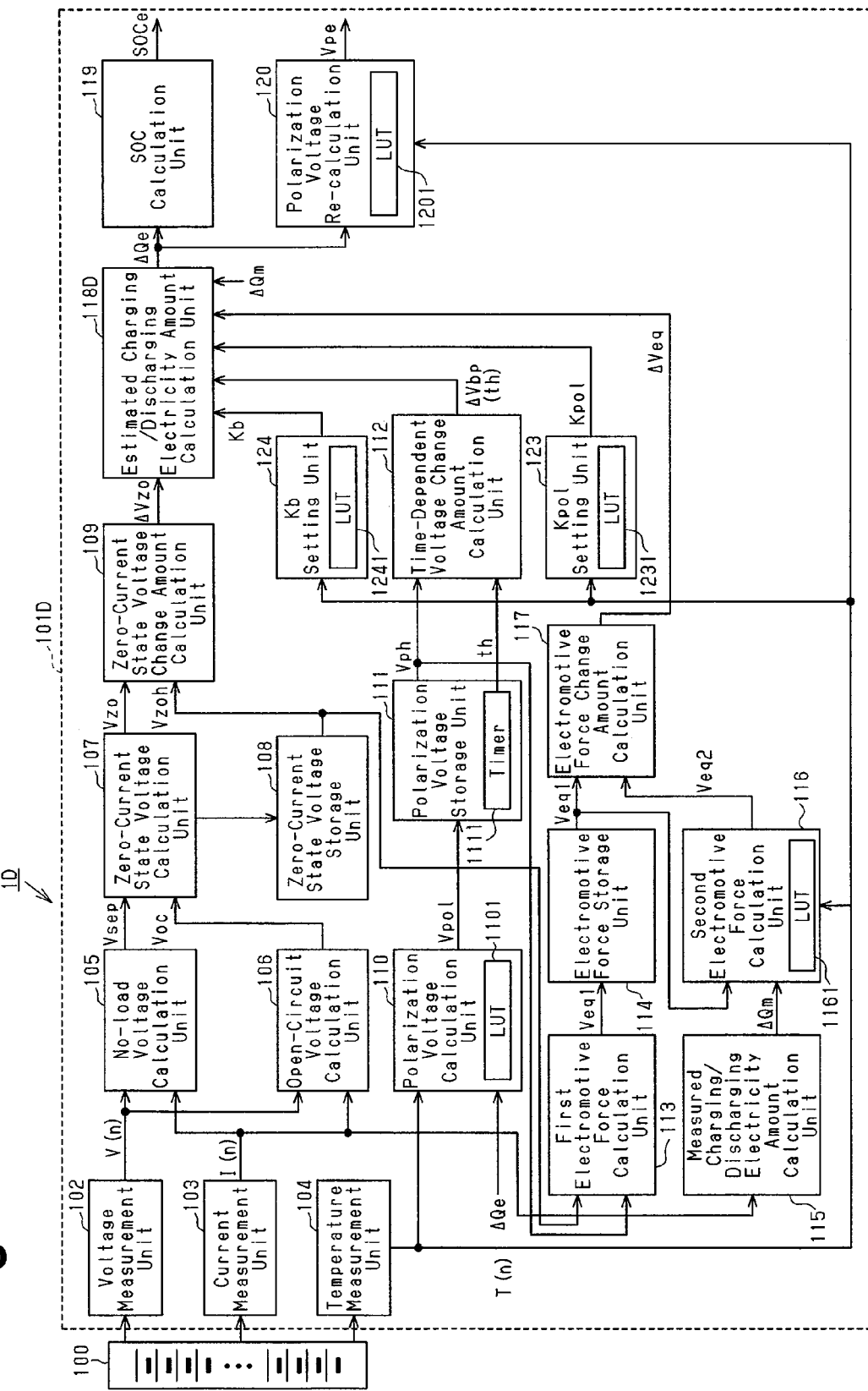
FIG. 9 is a block diagram showing an example structure of a battery pack system according to a fourth embodiment of the present invention.

FIG. 9 is a block diagram showing an example structure of a battery pack system 1D according to a fourth embodiment of the present invention. In FIG. 9, the components having the same structure and functions as the components of the first, second, and third embodiments illustrated in FIGS. 1, 3, and 6 will be given the same reference numbers as those components and will not be described.

A battery ECU 1D of the present embodiment calculates an estimated charging/discharging electricity amount ΔQe not only by using a zero-current state voltage change amount ΔVzo as in the first embodiment, but also by calculating a time-dependent voltage change amount ΔVbp(th) from a stored polarization voltage Vph and a stored time th and using the time-dependent voltage change amount ΔVbp(th) instead of using a voltage change amount adjustment constant ΔVbc as in the second embodiment, and further by calculating an electromotive force Veq1 from a zero-current state voltage Vzo and a polarization voltage Vpo, obtaining an electromotive force change amount ΔVeq from a stored electromotive force Veq1, and using a value obtained by dividing an electromotive force change amount ΔVeq by a measured charging/discharging electricity amount ΔQm obtained from current data I(n) instead of using an electromotive force change constant Keq as in the third embodiment.

In FIG. 9, a zero-current state voltage change amount ΔVzo from a zero-current state voltage change amount calculation unit 109, a voltage change amount adjustment coefficient Kb from a voltage change amount adjustment coefficient setting unit 124, a polarization voltage generation constant Kpol from a polarization voltage generation constant setting unit 123, a time-dependent voltage change amount ΔVbp(th) from a time-dependent voltage change amount calculation unit 112, an electromotive force change amount ΔVeq from an electromotive force change amount calculation unit 117, and a measured charging/discharging electricity amount ΔQm from a measured charging/discharging electricity amount calculation unit 115 are input into an estimated charging/discharging electricity amount calculation unit 118D. The estimated charging/discharging electricity amount calculation unit 118D calculates an estimated charging/discharging electricity amount ΔQe as a function of the zero-current state voltage change amount ΔVzo, the time-dependent voltage change amount ΔVbp(th), the electromotive force change amount ΔVeq, and the measured charging/discharging electricity amount ΔQm using the following expression.

$$\Delta Qe = Kb^*(\Delta Vzo + \Delta Vbp(th))/(\Delta Veq/\Delta Qm + Kpol)$$

The remaining structure and functions are the same as in the first, second, and third embodiments.

In the present embodiment, the time-dependent voltage change amount ΔVbp(th) is used instead of the voltage change amount adjustment constant ΔVbc, and the estimated charging/discharging electricity amount ΔQe is calculated from the electromotive force change amount according to the voltage change amount (ΔVzo+ΔVbc). This improves the calculation accuracy of the estimated charging/discharging electricity amount ΔQe as compared with the first, second, and third embodiments.

The processing procedures for estimating the SOC and the polarization voltage in the battery pack system with the above-described structure of the present embodiment will now be described with reference to FIG. 10.

Figure 10:
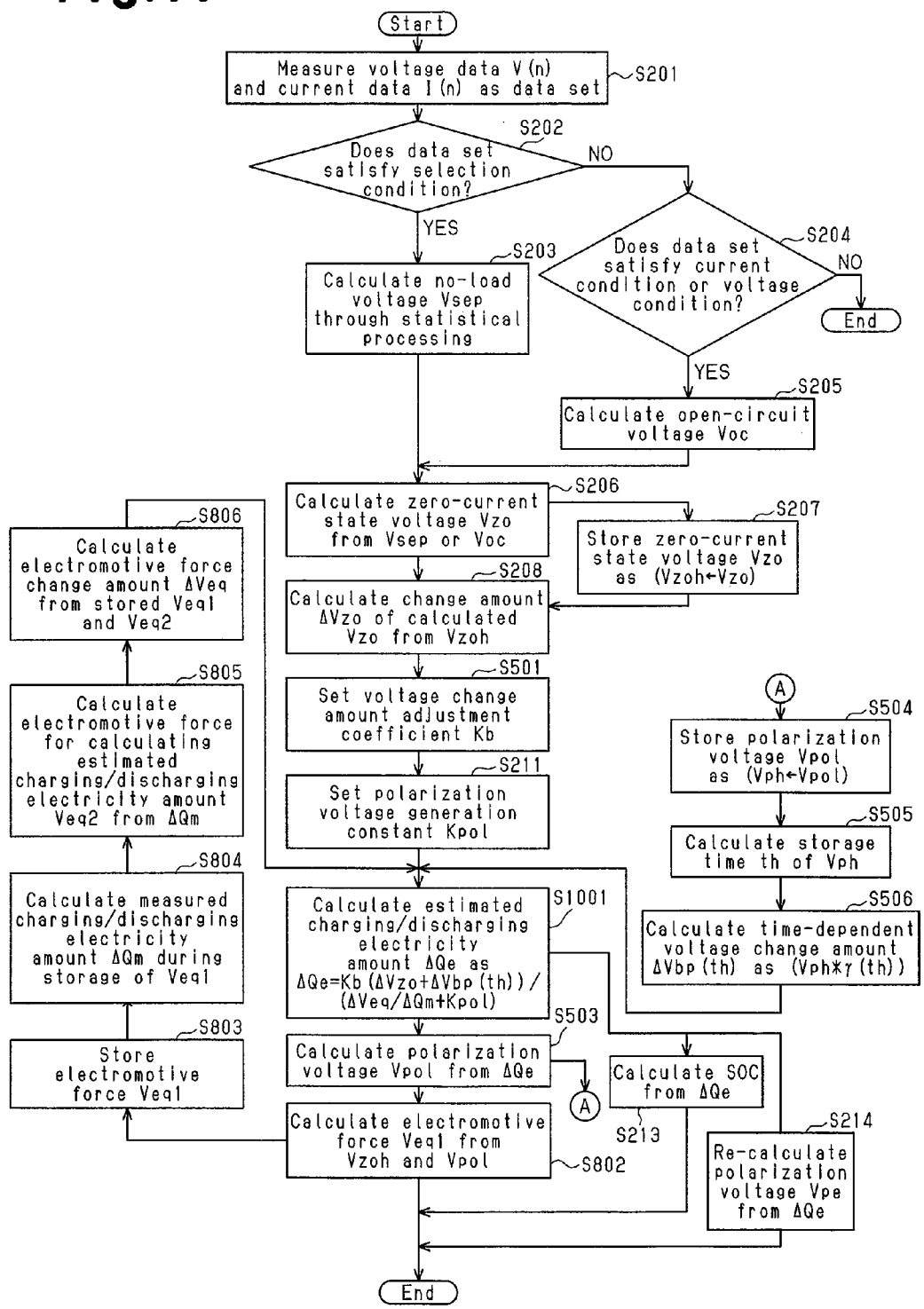
FIG. 10 is a flowchart showing the processing procedures for an SOC estimation method and a polarization voltage estimation method including a charging/discharging electricity amount estimation method for a rechargeable battery according to the fourth embodiment.

FIG. 10 is a flowchart showing the processing procedures for an SOC estimation method and a polarization voltage estimation method including a rechargeable battery charging/discharging electricity amount estimation method according to the fourth embodiment. In FIG. 10, the steps that are the same as the steps of the first, second, and third embodiments illustrated in FIGS. 2, 5, and 8 will be given the same reference numbers as those steps and will not be described.

In FIG. 10, the processing procedures differ from the first, second, and third embodiments in the processing in step S1001 for calculating the estimated charging/discharging electricity amount ΔQe. The processing in step S1001 is described above.

Figure 11:
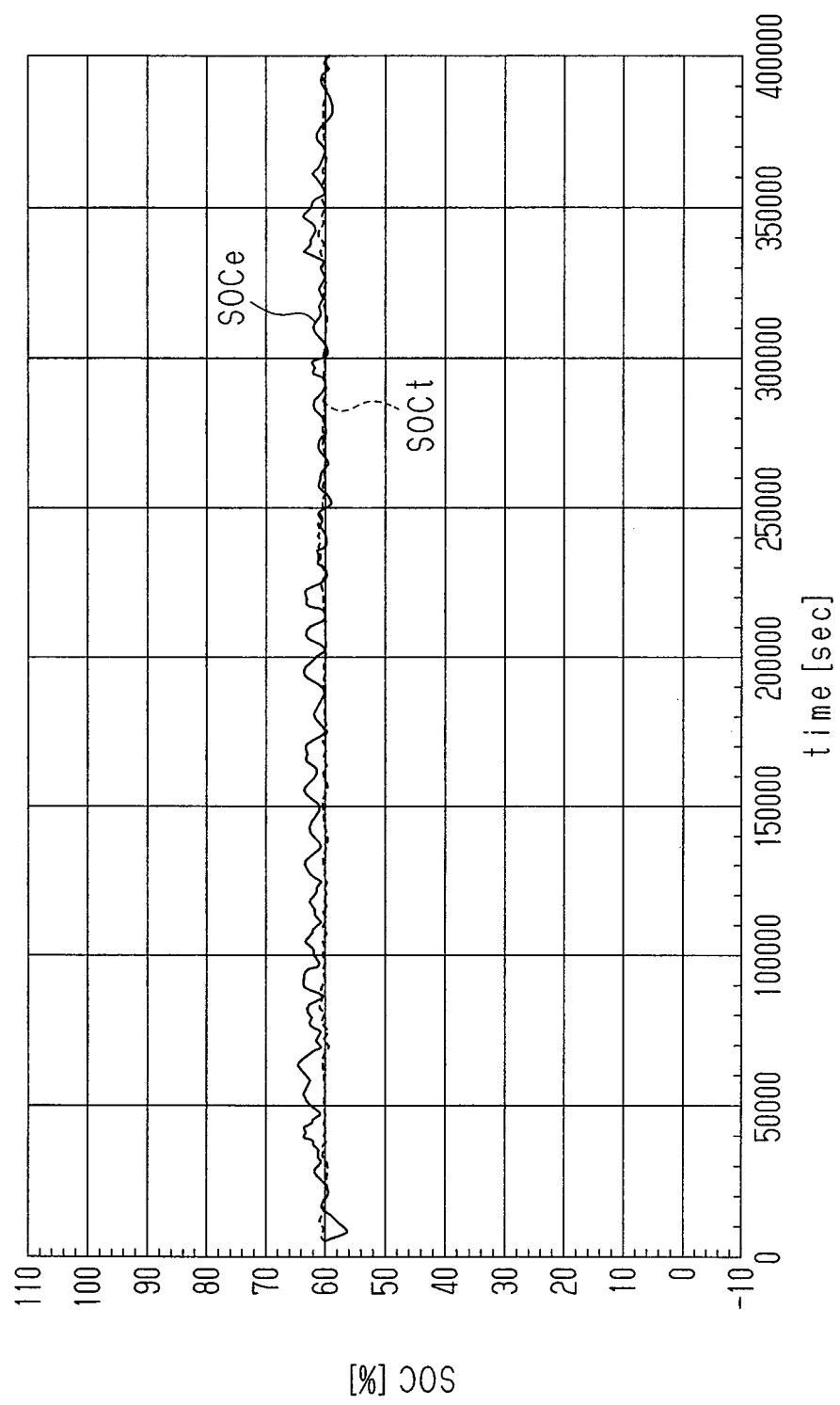
FIG. 11 is a graph showing time changes of an estimated charging/discharging electricity amount ΔQe calculated based on the flowchart of FIG. 10 and time changes of a true charging/discharging electricity amount ΔQt calculated based on an integrated current value measured using a high-precision current sensor.

FIG. 11 is a graph showing time changes (indicated by a solid line) of the estimated charging/discharging electricity amount ΔQe calculated based on the flowchart of FIG. 10 in the present embodiment and time changes (indicated by a broken line) of the charging/discharging electricity amount ΔQt (referred to as "true charging/discharging electricity amount" in the present specification) calculated based on an integrated value of current measured by a high-precision current sensor (including no current error).

As shown in FIG. 11, the present embodiment enables the estimated charging/discharging electricity amount ΔQe to approach the true charging/discharging electricity amount ΔQt.

INDUSTRIAL APPLICABILITY

As described above, the rechargeable battery charging/discharging current estimation method and apparatus of the present invention calculate the estimated charging/discharging electricity amount including almost no current measurement error from the measured voltage that involves little influence of a current measurement error (no-load voltage or open-circuit voltage) or from the measured charging/discharging electricity amount including a current measurement error. Further, the rechargeable battery polarization voltage estimation method and apparatus and the rechargeable battery SOC estimation method and apparatus of the present invention use the estimated charging/discharging electricity amount including almost no current measurement error to estimate the polarization voltage and the SOC that are not influenced by a current measurement error, so that the methods and apparatuses of the present invention are applicable to electric vehicles that require highly precise SOC estimation, such as a pure electric vehicle (PEV), a hybrid electric vehicle (HEV), and a hybrid electric automobile using a fuel battery and a rechargeable battery.

The invention claimed is:

1. A method for estimating a charging/discharging electricity amount of a rechargeable battery, the method comprising the steps of:

measuring a data set of current flowing through the rechargeable battery and terminal voltage of the rechargeable battery corresponding to the current, and obtaining a plurality of the data sets;

calculating a no-load voltage that is a voltage intercept of an approximate line at a zero-current state obtained through statistical processing using the plurality of data sets when a specific selection condition is satisfied;

calculating an open-circuit voltage from the terminal voltage of the rechargeable battery when a specific current condition or voltage condition is satisfied continuously for a certain period of time;

calculating a zero-current state voltage (Vzo) from the no-load voltage or the open-circuit voltage by selecting the no-load voltage as the zero-current state voltage when the specific selection condition is satisfied or by selecting the open-circuit voltage as the zero-current state voltage when the specific condition is not satisfied but the specific current condition or voltage condition is satisfied for the certain period of time;

storing the zero-current state voltage;

calculating a zero-current state voltage change amount (ΔVzo) during a period from when the zero-current state voltage is stored to when a zero-current state voltage is calculated subsequently; and calculating an estimated charging/discharging electricity amount (ΔQe) of the rechargeable battery based on the zero-current state voltage change amount.

2. The rechargeable battery charging/discharging electricity amount estimation method according to claim 1, further comprising the steps of:

presetting a voltage change amount adjustment constant (ΔVbc) and a voltage change amount adjustment coefficient (Kb), which are determined depending on a physical property and a charging/discharging state of the rechargeable battery, for the zero-current state voltage change amount (ΔVzo);

presetting an electromotive force change constant (Keq) that is a change amount of an electromotive force for a charging/discharging electricity amount in a usage region of a state of charge and that is determined depending on the physical property and the charging/discharging state of the rechargeable battery; and presetting a polarization voltage generation constant (Kpol) that is a change amount of a polarization voltage for a charging/discharging electricity amount in a usage region of a state of charge and that is determined depending on the physical property and the charging/discharging state of the rechargeable battery;

wherein the estimated charging/discharging electricity amount ΔQe is calculated as a function of the zero-current state voltage change amount (ΔVzo) using the expression of ΔQe=Kb*(ΔVzo+ΔVbc)/(Keq+Kpol).

3. The rechargeable battery charging/discharging electricity amount estimation method according to claim 1, further comprising the steps of:

calculating a polarization voltage (Vpol) of the rechargeable battery based on the estimated charging/discharging electricity amount;

storing the calculated polarization voltage;

calculating a storage time (th) of the polarization voltage; and calculating a time-dependent voltage change amount (ΔVbp(th)) based on the stored polarization voltage and the storage time;

wherein the step of calculating the estimated charging/discharging electricity amount includes calculating an estimated charging/discharging electricity amount based on the time-dependent voltage change amount in addition to the zero-current state voltage change amount.

4. The rechargeable battery charging/discharging electricity amount estimation method according to claim 3, wherein the step of calculating the time-dependent voltage change amount includes calculating a time-dependent voltage change amount by multiplying the stored polarization voltage by a polarization attenuation ratio that is a function of the storage time.

5. The rechargeable battery charging/discharging electricity amount estimation method according to claim 3, further comprising the steps of:

presetting a voltage change amount adjustment coefficient (Kb), which is determined depending on a physical property and a charging/discharging state of the rechargeable battery, for the zero-current state voltage change amount (ΔVzo);

presetting an electromotive force change constant (Keq) that is a change amount of an electromotive force with respect to a charging/discharging electricity amount in a usage region of a state of charge and that is determined depending on the physical property and the charging/discharging state of the rechargeable battery; and presetting a polarization voltage generation constant (Kpol) that is a change amount of a polarization voltage with respect to a charging/discharging electricity amount in a usage region of a state of charge and that is determined depending on the physical property and the charging/discharging state of the rechargeable battery;

wherein the estimated charging/discharging electricity amount $\Delta Qe$ is calculated as a function of the zero-current state voltage change amount $\Delta Vzo$ and the time-dependent voltage change amount $\Delta Vbp(th)$ using the expression of $\Delta Qe=Kb*(\Delta Vzo+\Delta Vbp(th))/(Keq+Kpol)$.

6. The rechargeable battery charging/discharging electricity amount estimation method according to claim 1, further comprising the steps of:

calculating a polarization voltage of the rechargeable battery based on the estimated charging/discharging electricity amount;

calculating an electromotive force (Veq) of the rechargeable battery based on the stored zero-current state voltage and the polarization voltage;

storing the calculated electromotive force;

calculating a measured charging/discharging electricity amount ($\Delta Qm$) during a period in which the electromotive force is being stored from current flowing through the rechargeable battery;

calculating an electromotive force for calculating the estimated charging/discharging electricity amount (Veq2) based on the stored electromotive force and the measured charging/discharging electricity amount; and calculating an electromotive force change amount ($\Delta Veq$) that is a difference between the electromotive force for calculating the estimated charging/discharging electricity amount and the stored electromotive force;

wherein the step of calculating the estimated charging/discharging electricity amount includes calculating an estimated charging/discharging electricity amount based on the electromotive force change amount in addition to the zero-current state voltage change amount.

7. The rechargeable battery charging/discharging electricity amount estimation method according to claim 6, wherein the step of calculating the electromotive force for calculating the estimated charging/discharging electricity amount includes calculating, as the electromotive force for calculating the estimated charging/discharging electricity amount (Veq2), an electromotive force corresponding to a state of charge obtained by subtracting or adding the measured charging/discharging electricity amount ($\Delta Qm$) from or to a state of charge corresponding to the stored electromotive force by referring to an electromotive force characteristic with respect to a state of charge of the rechargeable battery that is prepared beforehand and is parameterized by a temperature.

8. The rechargeable battery charging/discharging electricity amount estimation method according to claim 6, further comprising the steps of:

presetting for the zero-current state voltage change amount ($\Delta Vzo$) a voltage change amount adjustment constant ($\Delta Vbc$) and a voltage change amount adjustment coefficient (kb) that are determined depending on a physical property and a charging/discharging state of the rechargeable battery; and presetting a polarization voltage generation constant (Kpol) that is a change amount of a polarization voltage for a charging/discharging electricity amount in a usage region of a state of charge and that is determined depending on the physical property and the charging/discharging state of the rechargeable battery;

wherein the estimated charging/discharging electricity amount $\Delta Qe$ is calculated as a function of the zero-current state voltage change amount $\Delta Vzo$, the electromotive force change amount $\Delta Veq$, and the measured charging/discharging electricity amount $\Delta Qm$ using the expression of $\Delta Qe=Kb*(\Delta Vzo+\Delta Vbc)/(\Delta Veq/\Delta Qm+Kpol)$.

9. The rechargeable battery charging/discharging electricity amount estimation method according to claim 1, further comprising the steps of:

calculating a polarization voltage (Vpol) of the rechargeable battery based on the estimated charging/discharging electricity amount;

storing the calculated polarization voltage;

calculating a storage time (th) of the polarization voltage;

calculating a time-dependent voltage change amount ($\Delta Vbp(th)$) based on the stored polarization voltage and the storage time;

calculating an electromotive force of the rechargeable battery based on the stored zero-current state voltage and the stored polarization voltage;

storing the calculated electromotive force;

calculating a measured charging/discharging electricity amount ($\Delta Qm$) during a period in which the electromotive force is being stored from current flowing through the rechargeable battery;

calculating an electromotive force for calculating the estimated charging/discharging electricity amount based on the stored electromotive force and the measured charging/discharging electricity amount; and calculating an electromotive force change amount ($\Delta Veq$) that is a difference between the electromotive force for calculating the estimated charging/discharging electricity amount and the stored electromotive force;

wherein the step of calculating the estimated charging/discharging electricity amount includes calculating an estimated charging/discharging electricity amount based on the time-dependent voltage change amount and the electromotive force change amount in addition to the zero-current state voltage change amount.

10. The rechargeable battery charging/discharging electricity amount estimation method according to claim 9, wherein the step of calculating the time-dependent voltage change amount includes calculating a time-dependent voltage change amount by multiplying the stored polarization voltage by a polarization attenuation ratio that is a function of the storage time.

11. The rechargeable battery charging/discharging electricity amount estimation method according to claim 9, wherein the step of calculating the electromotive force for calculating the estimated charging/discharging electricity amount includes calculating, as the electromotive force for calculating the estimated charging/discharging electricity amount (Veq2), an electromotive force corresponding to a state of charge obtained by subtracting or adding the measured charging/discharging electricity amount ($\Delta Qm$) from or to a state of charge corresponding to the stored electromotive force by referring to an electromotive force characteristic with respect to a state of charge of the rechargeable battery that is preset and is parameterized by a temperature.

12. The rechargeable battery charging/discharging electricity amount estimation method according to claim 9, further comprising the steps of:

presetting an adjustment coefficient (Kb), which is determined depending on a physical property and a charging/ discharging state of the rechargeable battery, for the zero-current state voltage change amount ($\Delta Vzo$); and presetting a polarization voltage generation constant (Kpol) that is a change amount of a polarization voltage for a charging/discharging electricity amount in a usage area of a state of charge and that is determined depending on the physical property and the charging/discharging state of the rechargeable battery;

wherein the estimated charging/discharging electricity amount $\Delta Qe$ is calculated as a function of the zero-current state voltage change amount $\Delta Vzo$, the time-dependent voltage change amount $\Delta Vbp(th)$, the electromotive force change amount $\Delta Veq$, and the measured charging/discharging electricity amount $\Delta Qm$ using the expression of $\Delta Qe=Kb*(\Delta Vzo+\Delta Vbp(th))/(\Delta Veq/\Delta Qm+Kpol)$.

13. An apparatus for estimating a charging/discharging electricity amount of a rechargeable battery, the apparatus comprising:

a current measurement unit for measuring current flowing through the rechargeable battery as current data;

a voltage measurement unit for measuring terminal voltage of the rechargeable battery as voltage data;

a no-load voltage calculation unit for obtaining a plurality of data sets, each including current data from the current measurement unit and voltage data from the voltage measurement unit corresponding to the current data, and for calculating a no-load voltage that is a voltage intercept of a regression line at a zero-current state obtained through statistical processing using the plurality of data sets when a specific selection condition is satisfied;

an open-circuit voltage calculation unit for calculating an open-circuit voltage from the terminal voltage of the rechargeable battery when a specific current condition or voltage condition is satisfied continuously for a predetermined period of time;

a zero-current state voltage calculation unit for calculating a zero-current state voltage (Vzo) from the no-load voltage or the open-circuit voltage, wherein the zero-current state voltage calculation unit selects the no-load voltage as the zero-current state voltage when the specific selection condition is satisfied or selects the open-circuit voltage as the zero-current state voltage when the specific condition is not satisfied but the specific current condition or voltage condition is satisfied for the certain period of time;

a zero-current state voltage storage unit for storing the zero-current state voltage;

a zero-current state voltage change amount calculation unit for calculating a zero-current state voltage change amount ($\Delta Vzo$) during a period from when the zero-current state voltage is stored to when a zero-current state voltage is calculated subsequently; and an estimated charging/discharging electricity amount calculation unit for calculating an estimated charging/discharging electricity amount ($\Delta Qe$) of the rechargeable battery based on the zero-current state voltage change amount.

14. The rechargeable battery charging/discharging electricity amount estimation apparatus according to claim 13, further comprising:

a voltage change amount adjustment constant-adjustment coefficient setting unit for presetting a voltage change amount adjustment constant ($\Delta Vbc$) and a voltage change amount adjustment coefficient (Kb), which are determined depending on a physical property and a charging/discharging state of the rechargeable battery, for the zero-current state voltage change amount ($\Delta Vzo$);

an electromotive force change constant setting unit for presetting an electromotive force change constant (Keq) that is a change amount of an electromotive force with respect to a charging/discharging electricity amount in a usage region of a state of charge and that is determined depending on the physical property and the charging/discharging state of the rechargeable battery; and a polarization voltage generation constant setting unit for presetting a polarization voltage generation constant (Kpol) that is a change amount of a polarization voltage with respect to a change amount of a charging/discharging electricity amount in a usage region of a state of charge and that is determined depending on the physical property and the charging/discharging state of the rechargeable battery;

wherein the estimated charging/discharging electricity amount calculation unit calculates the estimated charging/discharging electricity amount $\Delta Qe$ as a function of the zero-current state voltage change amount $\Delta Vzo$ using the expression of $\Delta Qe=Kb*(\Delta Vzo+\Delta Vbc)/(Keq+Kpol)$.

15. The rechargeable battery charging/discharging electricity amount estimation apparatus according to claim 13, further comprising:

a polarization voltage calculation unit for calculating a polarization voltage (Vpol) of the rechargeable battery based on the estimated charging/discharging electricity amount;

a polarization voltage storage unit for storing the polarization voltage calculated by the polarization voltage calculation unit; and a time-dependent voltage change amount calculation unit for calculating a time-dependent voltage change amount ($\Delta Vbp(th)$) based on the polarization voltage stored in the polarization voltage storage unit and a storage time of the polarization voltage;

wherein the estimated charging/discharging electricity amount calculation unit calculates the estimated charging/discharging electricity amount based on the time-dependent voltage change amount in addition to the zero-current state voltage change amount.

16. The rechargeable battery charging/discharging electricity amount estimation apparatus according to claim 15, wherein the time-dependent voltage change amount calculation unit calculates the time-dependent voltage change amount by multiplying the polarization voltage stored in the polarization voltage storage unit by a polarization attenuation ratio that is a function of the storage time.

17. The rechargeable battery charging/discharging electricity amount estimation apparatus according to claim 15, further comprising:

a voltage change amount adjustment coefficient setting unit for presetting a voltage change amount adjustment coefficient (Kb), which is determined depending on a physical property and a charging/discharging state of the rechargeable battery, for the zero-current state voltage change amount ($\Delta Vzo$);

an electromotive force change constant setting unit for presetting an electromotive force change constant (Keq) that is a change amount of an electromotive force with respect to a charging/discharging electricity amount in a usage region of a state of charge and that is determined depending on the physical property and the charging/discharging state of the rechargeable battery; and a polarization voltage generation constant setting unit for presetting a polarization voltage generation constant (Kpol) that is a change amount of a polarization voltage with respect to a change amount of a charging/discharging electricity amount in a usage region of a state of charge and that is determined depending on the physical property and the charging/discharging state of the rechargeable battery;

wherein the estimated charging/discharging electricity amount calculation unit calculates the estimated charging/discharging electricity amount $\Delta Qe$ as a function of the zero-current state voltage change amount $\Delta Vzo$ and the time-dependent voltage change amount $\Delta Vbp(th)$ using the expression of $\Delta Qe=Kb*(\Delta Vzo+\Delta Vbp(th))/(Keq+Kpol)$.

18. The rechargeable battery charging/discharging electricity amount estimation apparatus according to claim 13, further comprising:

a polarization voltage calculation unit for calculating a polarization voltage of the rechargeable battery based on the estimated charging/discharging electricity amount;

a first electromotive force calculation unit for calculating an electromotive force (Veq) of the rechargeable battery based on the zero-current state voltage stored in the zero-current state voltage storage unit and the polarization voltage calculated by the polarization voltage calculation unit;

an electromotive force storage unit for storing the electromotive force calculated by the first electromotive force calculation unit;

a measured charging/discharging electricity amount calculation unit for calculating a measured charging/discharging electricity amount ($\Delta Qm$) during a period in which the electromotive force is being stored in the electromotive force storage unit from current flowing through the rechargeable battery;

a second electromotive force calculation unit for calculating an electromotive force for calculating the estimated charging/discharging electricity amount (Veq2) based on the electromotive force stored in the electromotive force storage unit and the measured charging/discharging electricity amount; and an electromotive force change amount calculation unit for calculating an electromotive force change amount ($\Delta Veq$) that is a difference between the electromotive force for calculating the estimated charging/discharging electricity amount and the electromotive force stored in the electromotive force storage unit;

wherein the estimated charging/discharging electricity amount calculation unit calculates the estimated charging/discharging electricity amount based on the electromotive force change amount in addition to the zero-current state voltage change amount.

19. The rechargeable battery charging/discharging electricity amount estimation apparatus according to claim 18, wherein the second electromotive force calculation unit calculates, as the electromotive force for calculating the estimated charging/discharging electricity amount (Veq2), an electromotive force corresponding to a state of charge obtained by subtracting or adding the measured charging/discharging electricity amount ($\Delta Qm$) from or to a state of charge corresponding to the electromotive force stored in the electromotive force storage unit by referring to an electromotive force characteristic with respect to a state of charge of the rechargeable battery that is prepared beforehand and is parameterized by a temperature.

20. The rechargeable battery charging/discharging electricity amount estimation apparatus according to claim 18, further comprising:

a voltage change amount adjustment constant-adjustment coefficient setting unit for presetting a voltage change amount adjustment constant ($\Delta Vbc$) and a voltage change amount adjustment coefficient (Kb), which are determined depending on a physical property and a charging/discharging state of the rechargeable battery, for the zero-current state voltage change amount ($\Delta Vzo$); and a polarization voltage generation constant setting unit for presetting a polarization voltage generation constant (Kpol) that is a change amount of a polarization voltage with respect to a charging/discharging electricity amount in a usage region of a state of charge and that is determined depending on the physical property and the charging/discharging state of the rechargeable battery;

wherein the estimated charging/discharging electricity amount calculation unit calculates the estimated charging/discharging electricity amount $\Delta Qe$ as a function of the zero-current state voltage change amount $\Delta Vzo$, the electromotive force change amount $\Delta Veq$, and the measured charging/discharging electricity amount $\Delta Qm$ using the expression of $\Delta Qe=Kb*(\Delta Vzo+\Delta Vbc)/(\Delta Veq/\Delta Qm+Kpol)$.

21. The rechargeable battery charging/discharging electricity amount estimation apparatus according to claim 13, further comprising:

a polarization voltage calculation unit for calculating a polarization voltage (Vpol) of the rechargeable battery based on the estimated charging/discharging electricity amount;

a polarization voltage storage unit for storing the polarization voltage calculated by the polarization voltage calculation unit;

a time-dependent voltage change amount calculation unit for calculating a time-dependent voltage change amount ($\Delta Vbp(th)$) based on the polarization voltage stored in the polarization voltage storage unit and a storage time;

a first electromotive force calculation unit for calculating an electromotive force (Veq) of the rechargeable battery based on the zero-current state voltage stored in the zero-current state voltage storage unit and the polarization voltage stored in the polarization voltage storage unit;

an electromotive force storage unit for storing the electromotive force calculated by the first electromotive force calculation unit;

a measured charging/discharging electricity amount calculation unit for calculating a measured charging/discharging electricity amount ($\Delta Qm$) during a period in which the electromotive force is being stored in the electromotive force storage unit from current flowing through the rechargeable battery;

a second electromotive force calculation unit for calculating an electromotive force for calculating the estimated charging/discharging electricity amount (Veq2) based on the electromotive force stored in the electromotive force storage unit and the measured charging/discharging electricity amount; and an electromotive force change amount calculation unit for calculating an electromotive force change amount ($\Delta Veq$) that is a difference between the electromotive force for calculating the estimated charging/discharging electricity amount and the electromotive force stored in the electromotive force storage unit;

wherein the estimated charging/discharging electricity amount calculation unit calculates the estimated charging/discharging electricity amount based on the time-dependent voltage change amount and the electromotive force change amount in addition to the zero-current state voltage change amount.

22. The rechargeable battery charging/discharging electricity amount estimation apparatus according to claim 21, wherein the time-dependent voltage change amount calculation unit calculates the time-dependent voltage change amount by multiplying the polarization voltage stored in the polarization voltage storage unit by a polarization attenuation ratio that is a function of the storage time.

23. The rechargeable battery charging/discharging electricity amount estimation apparatus according to claim 21, wherein the second electromotive force calculation unit calculates, as the electromotive force for calculating the estimated charging/discharging electricity amount (Veq2), an electromotive force corresponding to a state of charge obtained by subtracting or adding the measured charging/discharging electricity amount ($\Delta$Qm) from or to a state of charge corresponding to the electromotive force stored in the electromotive force storage unit by referring to an electromotive force characteristic with respect to a state of charge of the rechargeable battery that is prepared beforehand and is parameterized by a temperature.

24. The rechargeable battery charging/discharging electricity amount estimation apparatus according to claim 21, further comprising:
   a voltage change amount adjustment coefficient setting unit for presetting an adjustment coefficient (Kb), which is determined depending on a physical property and a charging/discharging state of the rechargeable battery, for the zero-current state voltage change amount ($\Delta$Vzo); and
   a polarization voltage generation constant setting unit for presetting a polarization voltage generation constant (Kpol) that is a change amount of a polarization voltage with respect to a charging/discharging electricity amount in a usage area of a state of charge and that is determined depending on the physical property and the charging/discharging state of the rechargeable battery;

wherein the estimated charging/discharging electricity amount calculation unit calculates the estimated charging/discharging electricity amount $\Delta$Qe as a function of the zero-current state voltage change amount $\Delta$Vzo, the time-dependent voltage change amount $\Delta$Vbp(th), the electromotive force change amount $\Delta$Veq, and the measured charging/discharging electricity amount $\Delta$Qm using the expression of $\Delta Qe=Kb*(\Delta Vzo+\Delta Vbp(th))/(\Delta Veq/\Delta Qm+Kpol)$.

25. A method for estimating a polarization voltage of a rechargeable battery, the method comprising the steps of:
   calculating an estimated charging/discharging electricity amount using the rechargeable battery charging/discharging electricity amount estimation method according to claim 1; and
   re-calculating a polarization voltage of the rechargeable battery based on the estimated charging/discharging electricity amount.

26. A method for estimating a state of charge of a rechargeable battery, the method comprising the steps of:
   calculating an estimated charging/discharging electricity amount using the rechargeable battery charging/discharging electricity amount estimation method according to claim 1; and
   calculating a state of charge of the rechargeable battery based on the estimated charging/discharging electricity amount.

27. An apparatus for estimating a polarization voltage of a rechargeable battery, the apparatus comprising:
   a polarization voltage re-calculation unit for re-calculating a polarization voltage of the rechargeable battery based on an estimated charging/discharging electricity amount calculated by the rechargeable battery charging/discharging electricity amount estimation apparatus according to claim 13.

28. An apparatus for estimating a state of charge of a rechargeable battery, the apparatus comprising:
   a state-of-charge calculation unit for calculating a state of charge of the rechargeable battery based on an estimated charging/discharging electricity amount calculated by the rechargeable battery charging/discharging electricity amount estimation apparatus according to claim 13.

* * * * *